(12) United States Patent
Nakamura et al.

(10) Patent No.: US 7,839,229 B2
(45) Date of Patent: Nov. 23, 2010

(54) VOLTAGE-CONTROLLED OSCILLATOR AND COMMUNICATION DEVICE USING THE SAME

(75) Inventors: Takahiro Nakamura, Kokubunji (JP); Toru Masuda, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/951,178

(22) Filed: Dec. 5, 2007

(65) Prior Publication Data

US 2008/0174375 A1 Jul. 24, 2008

(30) Foreign Application Priority Data

Jan. 19, 2007 (JP) ............................. 2007-010092

(51) Int. Cl.
*H03B 5/08* (2006.01)
*H03B 5/18* (2006.01)

(52) U.S. Cl. ...................... 331/167; 331/36 R; 331/74; 331/117 R; 331/177 V; 331/187; 455/77; 455/260

(58) Field of Classification Search ................... 333/25; 455/77; 331/16, 36 R, 36 L, 74, 86, 117 R, 331/140, 167, 177 V, 187
See application file for complete search history.

(56) References Cited

U.S. PATENT DOCUMENTS

| 4,945,317 | A | | 7/1990 | Sato et al. |
| 6,140,884 | A | | 10/2000 | Harpham et al. |
| 6,151,232 | A | * | 11/2000 | Furuhashi et al. ............ 363/97 |
| 6,429,748 | B2 | * | 8/2002 | Nicholls et al. ............... 331/56 |
| 6,621,363 | B2 | * | 9/2003 | Park et al. .............. 331/117 FE |
| 7,015,768 | B1 | * | 3/2006 | Talwalkar ................ 331/177 V |

(Continued)

FOREIGN PATENT DOCUMENTS

EP 0 220 914 A 5/1987

(Continued)

OTHER PUBLICATIONS

Hao Li et al., "Millimeter-Wave VCOs With Wide Tuning Range and Low Phase Noise, Fully Integrated in a SiGe Bipolar Production Technology" IEEE Journal of Solid-State Circuits, vol. 38, No. 2, Feb. 2003 pp. 184-191.

(Continued)

*Primary Examiner*—Arnold Kinkead
*Assistant Examiner*—Richard Tan
(74) *Attorney, Agent, or Firm*—Miles & Stockbridge P.C.

(57) ABSTRACT

The present invention provides a voltage-controlled oscillator operating from microwave frequencies to millimeter wave frequencies, which is capable of outputting a large power with an output impedance thereof being set up to a predetermined level at low power consumption, and a communication device using the same. The voltage-controlled oscillator includes: a differential alternating current generator including a resonator capable of varying resonant frequency according to an input control voltage, for generating a pair of differential alternating current each of which having the same frequency with the resonant frequency of the resonator yet being 180 degrees out of phase in mutual; a pair of transformers each of which having a primary inductor and a secondary inductor, for conducting the alternating current to the primary inductor; and an impedance-matching circuit connected to the secondary inductor of the transformers, wherein an output signal is outputted from the secondary inductors of the transformers.

24 Claims, 29 Drawing Sheets

U.S. PATENT DOCUMENTS

| | | | |
|---|---|---|---|
| 2003/0095458 A1 | 5/2003 | Park et al. | |
| 2004/0164817 A1* | 8/2004 | Nosaka | 333/25 |
| 2004/0222861 A1* | 11/2004 | Mondal et al. | 331/117 R |
| 2005/0176380 A1* | 8/2005 | Okabe et al. | 455/73 |
| 2005/0184820 A1* | 8/2005 | Hung et al. | 331/167 |
| 2006/0038628 A1* | 2/2006 | Khannur | 331/177 V |
| 2006/0097811 A1* | 5/2006 | Nakamura et al. | 331/167 |

FOREIGN PATENT DOCUMENTS

| | | |
|---|---|---|
| GB | 2 181 913 A | 4/1987 |
| JP | 54-032954 | 3/1979 |
| JP | 62-168429 A | 7/1987 |
| JP | 64-80112 A | 3/1989 |
| JP | 03-006911 A | 1/1991 |
| JP | 03-029504 A | 2/1991 |
| JP | 11-346115 A | 12/1999 |
| JP | 2003-168924 A | 6/2003 |
| JP | 2006-115337 A | 4/2006 |
| JP | 2006-135829 A | 5/2006 |

OTHER PUBLICATIONS

C. Lee et al., "SiGe BiCMOS 65-GHz BPSK Transmitter and 30 to 122 GHz LC-Varactor VCOs with up to 21% Tuning Range" 2004 IEEE CSIC Digest, pp. 179-182.

Hao Li et al., "Fully Integrated SiGe VCOs With Powerful Output Buffer for 77-GHz Automotive Radar Systems and Applications Around 100 GHz", IEEE Journal of Solid-State Circuits, vol. 39, No. 10, Oct. 2004, pp. 1650-1658.

* cited by examiner

VOLTAGE-CONTROLLED OSCILLATOR AND COMMUNICATION DEVICE USING THE SAME

CLAIM OF PRIORITY

The present invention claims priority from Japanese Patent Application JP 2007-10092 filed on Jan. 19, 2007, the content of which is hereby incorporated by reference onto the application.

FIELD OF THE INVENTION

The present invention relates to a voltage-controlled oscillator capable of setting an output impedance thereof to a predetermined value, and a communication device using the same.

BACKGROUND OF THE INVENTION

Hao Li, and Hans-Martin Rein, "Millimeter-Wave VCOs With Wide Tuning Range and Low Phase Noise, Fully Integrated in a SiGe Bipolar Production Technology," IEEE JOURNAL OF SOLID-STATE CIRCUITS, VOL. 38(2), pp. 184-191, 2003 discloses an oscillator whose output comes from a load-connected collector in a differential Colpitts oscillator effective for low phase noise performance. C. Lee, T. Yao, A. Mangan, K. Yau, M. A. Copeland and S. P. Voinigescu, "SiGe BICMOS 65-GHz BPSK Transmitter and 30 to 122 GHz LC-Varactor VCOs with up to 21% Tuning Range," IEEE CSIC Digest, pp. 179-182, 2004 discloses an oscillator using a cascode amplifier for output. Hao Li, Hans-Martin Rein, Thomas Suttorp, and Josef Bock, "Fully Integrated SiGe VCOs with Powerful Output Buffer for 77-GHz Automotive Radar Systems and Applications around 100 GHz," IEEE JOURNAL OF SOLID-STATE CIRCUITS, VOL. 39(10), pp. 1650-1658, 2004 discloses an oscillator having, at its rear stage, a driver amplifier for output.

In addition, an oscillator using a transformer for output has been introduced. For example, Japanese Patent Application Laid-Open Publication No. S54-32954 (1979) discloses a differential Colpitts oscillator using an MOS transistor, in which drain outputs are outputted through the transformer. Japanese Patent Application Laid-Open Publication No. H03-29504 (1991) discloses a differential cross couple oscillator using an inductor of a resonator as a transformer to take out an output. UK Patent Application Publication No. 2181913 A (1987) discloses a differential Colpitts oscillator provided with a transformer at its collector using a bipolar transistor.

In order to supply power more efficiently to a load having a predetermined impedance, the above "Millimeter-Wave VCOs With Wide Tuning Range and Low Phase Noise, Fully Integrated in a SiGe Bipolar Production Technology," utilizes a load circuit provided to the collector for impedance matching, the above "SiGe BiCMOS 65-GHz BPSK Transmitter and 30 to 122 GHz LC-Varactor VCOs with up to 21% Tuning Range," utilizes a load circuit of the cascode amplifier for impedance matching, and the above "Fully Integrated SiGe VCOs with Powerful Output Buffer for 77-GHz Automotive Radar Systems and Applications around 100 GHz," utilizes a load circuit of the driver circuit for impedance matching. Meanwhile, each of Japanese Patent Application Laid-Open Publication Nos. S54-32954 and H03-29504, and UK Patent Application Publication No. 2181913 A realized impedance matching by adjusting the turn number of a transformer.

SUMMARY OF THE INVENTION

The following will now discuss oscillators using an LC resonator by way of explaining an object of the present invention.

An oscillator having a variable oscillation frequency is essential for communication devices such as a radio communication device or a memory. With technical advances in communication devices, there has been a significant increase in the use of high-frequency oscillators whose oscillation frequency ranges from microwaves to high microwaves (6 GHz-30 GHz) and millimeter waves (30 GHz-300 GHz). In a recent radio communication module for use in wireless communication system, particularly for use in a millimeter-wave band wireless communication system, the oscillator should be able to deliver an LO (Local Oscillator) signal with low phase noise and large signal power to a mixer circuit.

That is to say, it is important that an oscillator for use in millimeter-wave band radio communications must provide an LO signal with large signal power to the mixer circuit having a predetermined input impedance. To do so, the oscillator first matches an output impedance to a predetermined level and then provides a large power signal. Impedance matching needs to be done regardless of whether an oscillator or a mixer circuit is configured in a separate chip to form a radio communication module performing inter-chips transmission, or whether the oscillator and the mixer circuit are integrated on one semiconductor substrate. In particular, the impedance is crucial for high-frequency oscillators. Needless to say, such performance should be achieved at low power consumption.

FIG. 28 illustrates a circuit configuration of a voltage-controlled oscillator (VCO) of a conventional differential Colpitts type. An oscillation output is outputted from each emitter of bipolar transistors (BJT) Q1 and Q2. In addition, inductors LP11 and LP12 are used for isolating a current source 50 from outputs of the oscillator (OUT1 and OUT2) As a load circuit is connected to the emitters of Q1 and of Q2, i.e. the load circuit is connected in parallel to a resonator 10, oscillation frequency or phase noise is affected by the load circuit. Moreover, to achieve impedance matching, the impedance seen at the emitters of Q1 and of Q2 should be set to a predetermined level, and the impedance at the resonator should be matched to a predetermined output impedance. Because of this, it is important to design a resonator to be able to demonstrate oscillator performance providing low phase noise signals and realize impedance matching at the same time. However, these requirements add more difficulties in designing.

To avoid such problem, a voltage-controlled oscillator adopts the configuration shown in FIG. 29. FIG. 29 illustrates a differential Colpitts voltage-controlled oscillator that incorporates a BJT proposed in the non-patent reference 1. A resonator 10 is composed of inductors L11 and L12 and tunable capacitors CV11 and CV12 with parallel connections, respectively. Each collector of the BJT Q1 and Q2 has an impedance-matching circuit 40, and outputs of the oscillators OUT1 and OUT2 are taken out from the collectors of Q1 and Q2.

Since an alternating current of an oscillation frequency that is determined by the resonant frequency of a resonator 10 flows from the collector nodes of the Q1 and Q2 to the impedance-matching circuit 40, the impedance-matching circuit 40 converts the current into a voltage. That is, in order for the impedance-matching circuit 40 to convert/output a current signal of the oscillation frequency determined at the resonator 10 into a voltage signal, resonator parameters may be designed without taking account of impedance matching, thereby optimizing performance in the oscillator.

However, in the case of the oscillator shown in FIG. 29, phases of a collector signal and a base signal are different in 180 degree each other. If an output signal of the collector is enlarged, collector base capacitance between the base node and the collector node (CBC) looks larger because of the mirror effect. It causes the problem of narrowing the variable frequency range due to reduction of the turnable-capacitance ratio to the total capacitance of the oscillation circuit. Therefore, as in the oscillator proposed by the above "SiGe BiCMOS 65-GHz BPSK Transmitter and 30 to 122 GHz LC-Varactor VCOs with up to 21% Tuning Range", a cascode amplifier is additionally connected to the collectors of Q1 and of Q2 in FIG. 29 and an impedance-matching circuit is provided to the collector of the cascode amplifier, so that an output may be taken out from the collector of the cascode amplifier. With the use of the cascode amplifier, collector signals of the Q1 and Q2 have significantly reduced amplitude ranges. This enables to avoid an increase in capacitor between base and collector due to the mirror effect. Nevertheless, even this method has a drawback of high power consumption because an extra supply voltage is needed to make use of the cascode amplifier.

Meanwhile, the oscillator configuration discussed in the above "Fully Integrated SiGe VCOs with Powerful Output Buffer for 77-GHz Automotive Radar Systems and Applications around 100 GHz," does not include the cascode amplifier. Instead, it has a driver amplifier connected to the rear stage of the oscillator. However, the increasing power consumption problem is also found in this configuration because the driver circuit consumes current.

As mentioned earlier, Japanese Patent Application Laid-Open Publication No. H03-29504 discloses an oscillator introducing a transformer for output, which has adopted a conventional scheme for matching an output impedance through the impedance conversion. However, since the oscillator of Japanese Patent Application Laid-Open Publication No. 3-29504 uses an inductor of the resonator as a transformer, it is easily susceptive to the influence of noises from a load circuit connected to a secondary inductor of the transformer.

On the contrary, the oscillator disclosed in the patent reference 3 introduces an inductor that does not compose a resonator, but it also poses a problem of impedance matching at a high frequency. The reason for such problem will now be explained in reference to FIG. 30. FIG. 30 diagrammatically explains the impedance conversion using a conventional transformer. As shown in the drawing, the impedance converting circuit includes an impedance (Z1) circuit connected to a primary inductor L1 and a secondary inductor L2 coupled to the L1 through a mutual inductance M. An impedance Zout seen at a node A of the L2 can be described by the following equation 1.

$$Zout = j\omega L_2 + \frac{\omega^2 M^2}{Z_1 + j\omega L_1} \quad (1)$$

Here, ω indicates a frequency.

To achieve impedance matching only with the transformer, a reactance of the primary inductor of the transformer ωL1 should be sufficiently larger than the impedance Z1 on the converting side connected to the primary inductor. To this end, the inductance of the primary inductor of the transformer should be large enough. For example, suppose that the impedance of a circuit connected to the primary inductor at 60 GHz is 200Ω, the coupling coefficient of a transformer is 1, and the impedance is needed to be converted into 50Ω. Then, the inductance ratio between the primary inductor and the secondary inductor needs to be set to 2:1. To make ΩL1 ten times larger than Z1, the primary inductor with a 5-nH inductance or higher is required.

In practice, however, it is very difficult to manufacture an inductor demonstrating a 5-nH inductance at 60 GHz on a Si substrate. This is because an inductor on a semiconductor substrate is fabricated with several micron thick metal lines, and a parasitic capacitor exists between the metal line and the semiconductor substrate or between the lines. As the inductor on the semiconductor substrate is equivalently regarded as a parallel circuit of an inductor and a parasitic capacitor, it looks like a capacitive impedance at a high frequency. When the inductance is made large, the line for use in forming an inductor is made longer, causing the parasitic capacitor to increase also. Therefore, because the frequency is lowered when the impedance of an inductor changes from inductive to capacitive, it is hard to manufacture an inductor with a large inductance on a semiconductor substrate.

Besides, in the case that the parasitic capacitor discussed above also exists in the secondary inductor and if an output is provided to a load circuit of a subsequent stage through a bonding wire, the parasitic inductance of the bonding wire should be taken into account as well. Further, since the parasitic capacitor is connected in parallel with an output impedance while the parasitic inductance is connected serially to the transformer, a matching between the output impedance and the input impedance of the load circuit cannot be realized by the single transformer alone. That is, impedance matching method solely based on the transformer is not useful at a high frequency.

To be short, it has been difficult in a voltage-controlled oscillator to realize an output impedance matching to obtain a large oscillation output level with low power consumption.

It is, therefore, an object of the present invention to provide a voltage-controlled oscillator capable of outputting a large power signal by matching an output impedance to a predetermined level at low power consumption, and a communication device using the same.

In accordance with the present invention, there is provided a voltage controlled oscillator, comprising: a differential alternating current generator including a resonator capable of varying resonant frequency according to an input control voltage, for generating a pair of differential alternating current each of which having the same frequency with the resonant frequency of the resonator yet being 180 degrees out of phase in mutual; a pair of transformers each of which having a primary inductor and a secondary inductor, for conducting the alternating current to the primary inductor; and an impedance-matching circuit connected to the secondary inductor of the transformers, wherein an output signal is outputted from the secondary inductors of the transformers.

According to the present invention, it becomes possible to realize a voltage-controlled oscillator capable of outputting a large power signal by matching an output impedance to a predetermined level at low power consumption, and a communication device incorporating the same.

DESCRIPTION OF SPECIFIC EMBODIMENTS

Figure 1:
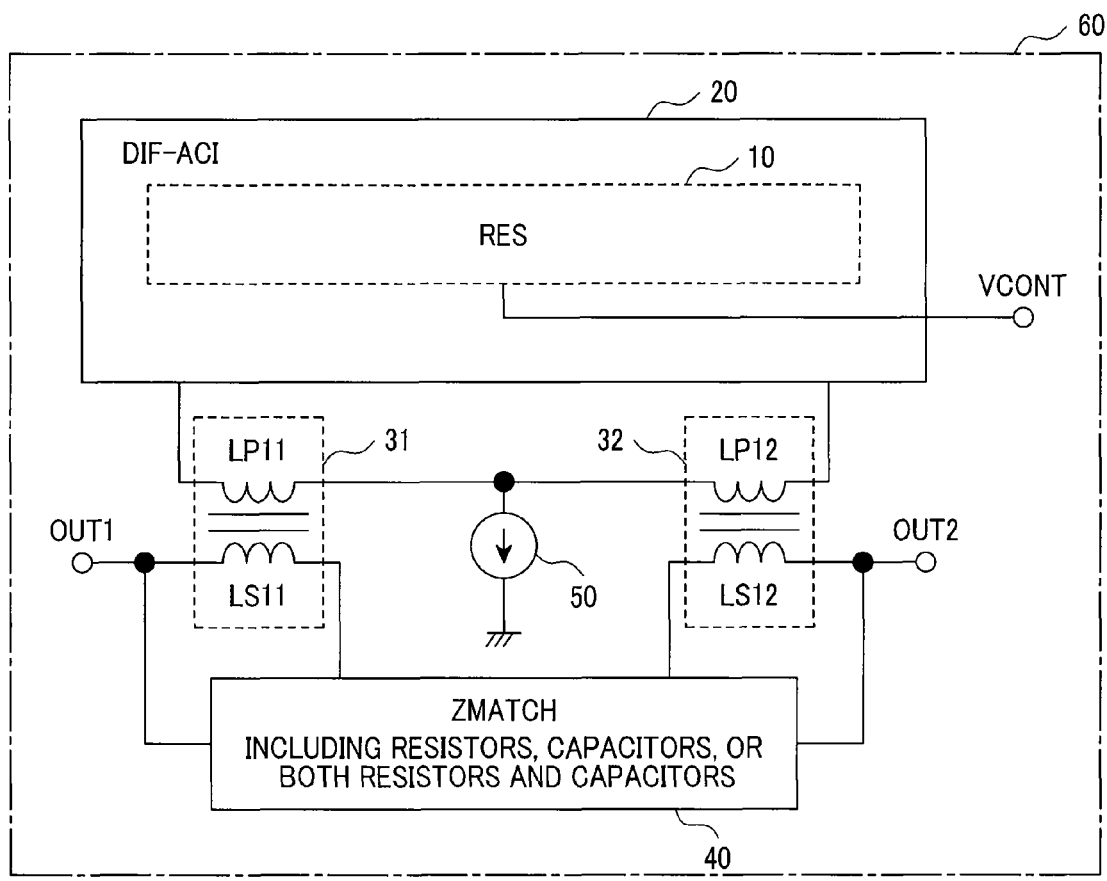
FIG. 1 is a schematic diagram of a voltage-controlled oscillator according to a first embodiment of the present invention.

Hereinafter, preferred embodiments of the present invention will be set forth in detail with reference to the accompanying drawings so that those skilled in the art can easily carry out the invention.

A voltage-controlled oscillator according to an exemplary embodiment of the present invention comprises a differential alternating current generator including a resonator capable of varying a resonant frequency by an input control voltage, for generating a pair of differential alternating current having the same frequency with the resonant frequency of the resonator yet being 180 degrees out of phase in mutual; a pair of transformers each of which having a primary inductor and a secondary inductor, for conducting the alternating current to each primary inductor; and an impedance-matching circuit connected to the secondary inductor of the transformers, wherein an output signal is outputted from the secondary inductors of the transformers.

By connecting the pair of transformers to a node free from the influence of a mirror, an increase in fixed capacitors may be avoided. Moreover, with the use of an impedance-matching circuit, even a high frequency oscillator operating from microwave frequencies to milli-meter wave frequencies can output a large signal power after matching its output impedance to a predetermined level. In addition, because the transformers experience a small voltage drop, the large signal power can be outputted at low power consumption. Also, the pair of transformers are easy to implement in a semiconductor device and highly practical.

Another exemplary embodiment of the present invention provides a wireless communication device with the voltage-controlled oscillator installed at a transceiving oscillator. In detail, the wireless communication device includes a low noise amplifier for amplifying a signal captured by a receiving antenna; a receiving mixer for converting the frequency of an output signal from the low noise amplifier; a receiving oscillator for generating a local-oscillator signal for the frequency conversion and outputting it to the receiving mixer; a transmission mixer for converting the frequency of a signal to be transmitted; a transmission oscillator for generating a local-oscillator signal for the frequency conversion and outputting it to the transmission mixer; a power amplifier for amplifying an output signal of the transmission mixer; and a transmission antenna for transmitting an output of the power amplifier. With the use of an oscillator characterized of a large output signal power, low power consumption, and a predetermined output impedance, the wireless communication device incorporating such oscillator demonstrates an improved receive sensitivity and a reduced total power consumption for the entire device.

Reference will now be made in detail to an embodiment of the present invention, examples of which are illustrated in the accompanying drawings, wherein the same reference numeral refer to the same element or a similar element in FIGS. 1 through 27.

Embodiment 1

A first embodiment of the present invention is explained with reference to FIGS. 1 through 3.

FIG. 1 is a schematic circuit diagram of a voltage-controlled oscillator according to a first embodiment of the present invention. FIG. 2 is a perspective view, showing that the voltage-controlled oscillator of the first embodiment is fabricated on a substrate. FIG. 3 diagrammatically shows reflection characteristics of the voltage-controlled oscillator of the first embodiment.

Figure 2:
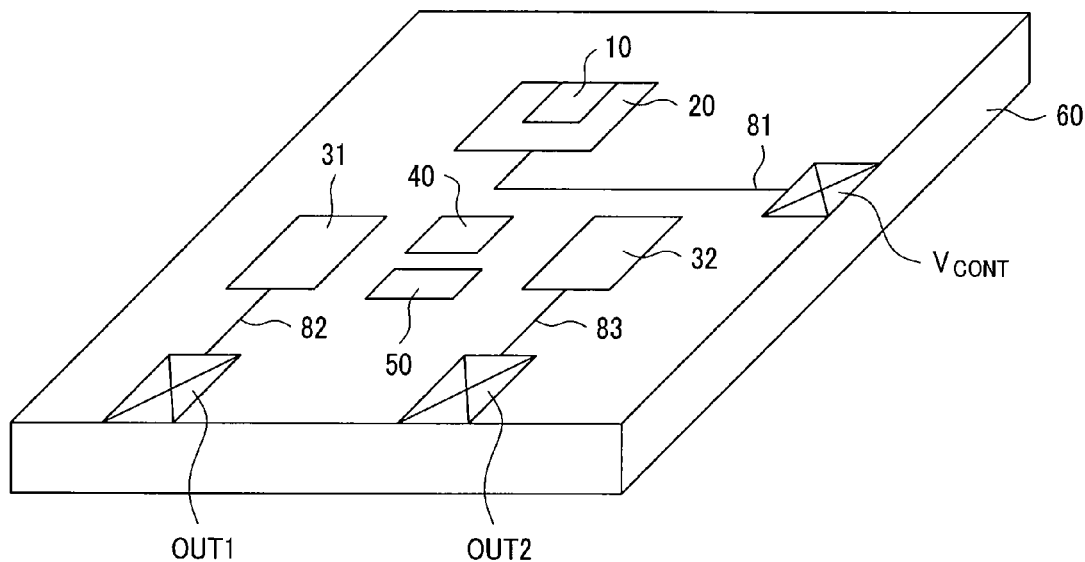
FIG. 2 is a perspective view, showing that the voltage-controlled oscillator of the first embodiment is fabricated on a Si substrate.

As can be seen in FIG. 1 and FIG. 2, a voltage-controlled oscillator of the present invention comprises a differential alternating current generator 20 including a resonator 10, for generating two-phase (a pair of differential) alternating current having the same frequency with the resonant frequency of the resonator 10 yet being 180 degrees out of phase in mutual; a pair of transformers 31 and 32, each having a primary inductor LP11, LP12 connected to the differential alternating current generator 20 and a secondary inductor LS11, LS12 connected to an impedance-matching circuit 40; and a current-source circuit 50. The impedance-matching circuit 40 comprises resistors or capacitors, or both resistors and capacitors. The voltage-controlled oscillator of this embodiment is formed on a Si substrate 60. Reference numerals 81 through 83 indicate lines formed on the Si substrate.

The oscillation frequency (f) of the voltage-controlled oscillator is determined by the resonant frequency of the resonator 10. The resonator 10 includes a frequency control terminal group VCONT composing at least one frequency control terminal capable of controlling the resonant frequency, and it can vary the oscillation frequency by a control signal group being inputted to the VCONT. Alternating current signals generated by the differential alternating current generator 20 are outputted from signal output terminals OUT1 and OUT2 after the current signals are converted into voltage signals by the transformer 31 and 32, and the output impedance is converted into a predetermined impedance by the transformers 31 and 32 that are not included in the resonator 10 and by the impedance-matching circuit 40. Primary inductors LP11 and LP12 also serve as isolation inductors between a current source and an oscillation signal.

The voltage-controlled oscillator according to this embodiment is capable of outputting a large signal power at low power consumption by setting an output impedance to a predetermined level.

Figure 3:
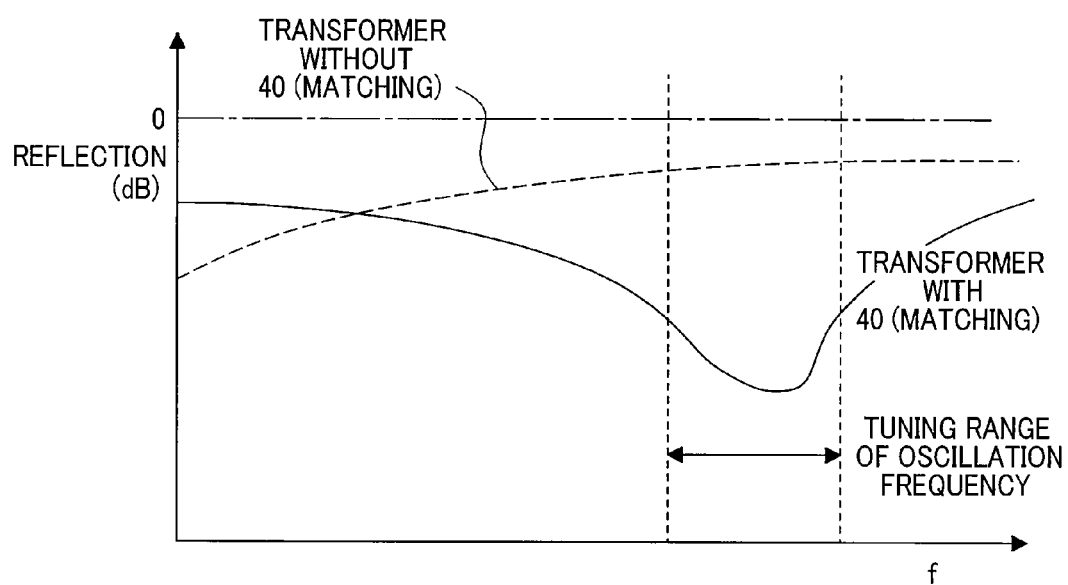
FIG. 3 diagrammatically shows reflection characteristics of the voltage-controlled oscillator of the first embodiment, compared with those of a conventional oscillator.

FIG. 3 diagrammatically shows reflection characteristics of the voltage-controlled oscillator of the first embodiment, compared with those of a conventional oscillator. When the oscillation frequency becomes high like millimeter-wave frequencies, impedance matching gets difficult and reflection becomes large. Thus, a conventional transformer scheme without an impedance-matching circuit 40 easily exhibits the frequency characteristics indicated by a broken line in FIG. 3. Meanwhile, according to the present invention, the use of an impedance-matching circuit 40 enables impedance matching to show the frequency characteristics with small reflection within a specific oscillation frequency range (communication band) of a high frequency required for the resonator as indicated by a solid line in FIG. 3. Especially, since the transformers 31 and 32 are not of the resonator 10, it is possible to design or configure the resonator 10 in a manner that the voltage-controlled oscillator 20 can provide optimal performance (variable frequency range or phase noise properties), independently of the output impedance. Therefore, the phase noise of this VCO can become better than those of a VCO of which output signal is outputted directly from the resonator, of which impedance is matched to the predetermined impedance.

In addition, with aid of the transformers 31 and 32 and the impedance-matching circuit 40, the signal power accumulated in the resonator can be transmitted efficiently to the circuit of a subsequent stage such as a mixer circuit having a predetermined input impedance with good impedance matching. Because impedance matching is achieved by using the transformers 31 and 32, the voltage drop is caused only by the serial resistors of the primary inductors of the transformers 31 and 32, and power consumption can also be lowered by reducing the supply voltage lower than for the cascode amplifier. Moreover, there is no need to increase current capacity because it requires a smaller current capacity than the driver amplifier. Again, power consumption is reduced after all.

That is, with the configuration shown in FIG. 1, signal power of the oscillation frequency being accumulated at the resonator is outputted after matching an output impedance to a predetermined impedance, so the voltage-controlled oscillator of this embodiment consumes less power and is capable of efficiently supplying a large signal power to the circuit of a subsequent stage. In addition, by implementing the impedance-matching circuit 40 into an element such as a resistor or a capacitor to be fabricated on a semiconductor substrate, a total number of components in the voltage-controlled oscillator may be reduced and the rise of the manufacturing cost for the oscillator can be avoided.

Embodiment 2

A second embodiment of the present invention is explained with reference to FIG. 4. A voltage-controlled oscillator of this embodiment comprises a differential alternating current generator 20 including a resonator 10, for generating two-phase (a pair of differential) alternating current having the same frequency with the resonant frequency of the resonator 10 yet being 180 degrees out of phase in mutual; and transformers 31 and 32, each having a primary inductor LP11, LP12 connected to the differential alternating current generator 20 and a secondary inductor LS11, LS12 connected to an impedance-matching circuit 40. The impedance-matching circuit 40 is connected serially to the secondary inductors of the transformers 31 and 32. The oscillation frequency of the voltage-controlled oscillator is determined by the resonant frequency of the resonator 10. The resonator 10 includes a frequency control terminal group VCONT composing at least one frequency control terminal capable of controlling the resonant frequency, and it can vary the oscillation frequency by a control signal group being inputted to the VCONT. The voltage-controlled oscillator of this embodiment is formed on a Si substrate (this is the same for the embodiments described hereinafter).

Alternating current signals generated by the differential alternating current generator 20 are outputted from signal output terminals OUT1 and OUT2 after the current signals are converted into voltage signals by the transformer 31 and 32, and the output impedance is converted into a predetermined impedance by the transformers 31 and 32 that are not included in the resonator 10 and by the impedance-matching circuit 40. Since the transformers 31 and 32 are not of the resonator 10, it is possible to design or configure the resonator 10 in a manner that the voltage-controlled oscillator 20 can provide optimal performance (variable frequency range or phase noise properties), independently of the output impedance. Therefore, the phase noise of this VCO can become better than those of a VCO of which output signal is outputted directly from the resonator, of which impedance is matched to the desired impedance.

In addition, with aid of the transformers 31 and 32 and the impedance-matching circuit 40, the signal power accumulated in the resonator can be transmitted efficiently to the circuit of a subsequent stage such as a mixer circuit having a predetermined input impedance with good impedance matching. An impedance (Zout) as the oscillator side is seen by an output terminal may be expressed by the following equation 2.

$$Zout = Z_2 + j\omega L_2 + \frac{\omega^2 M^2}{Z_1 + j\omega L_1} \quad (2)$$

In the equation (1) discussed earlier, impedance matching was realized only if $\omega L_1$ was sufficiently larger than $Z_1$. However, according to the equation (2), a simple addition of $Z_2$ can correct the impedance that could not be matched by the transformer alone, so impedance matching is realized even at a high frequency.

For instance, suppose that $Z_1=200\Omega$ needs to be converted into $Z_{OUT}=50\Omega$ at 60 GHz. Given that $L_1=500$ pH, $L_2=400$ pH, and M=300 pH, sum of the $2^{nd}$ term and $3^{rd}$ term on the right side of the equation (2) is equal to $(34+120\text{ j})\Omega$. Therefore, the output impedance can be set to $50\Omega$ by using an impedance element with $Z_2=(16-120\text{ j})\Omega$.

Because impedance matching is achieved by using the transformers 31 and 32, the voltage drop is caused only by the serial resistors of the primary inductors of the transformers 31 and 32, and power consumption can also be lowered by reducing the supply voltage lower than for the cascode amplifier.

Moreover, there is no need to increase current capacity because it requires a smaller current capacity than the driver amplifier. Again, power consumption is reduced after all.

Figure 4:
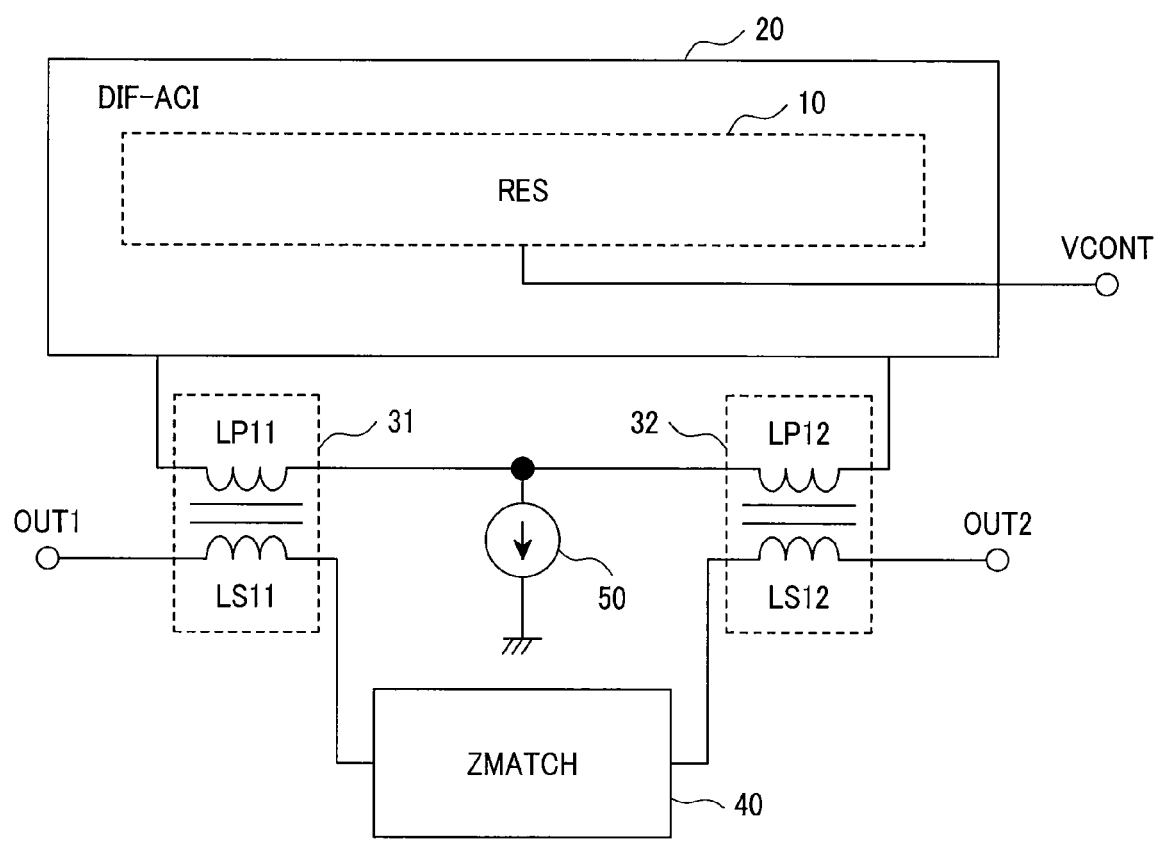
FIG. 4 is a schematic diagram of a voltage-controlled oscillator according to a second embodiment of the present invention.

That is, with the configuration shown in FIG. 4, signal power of the oscillation frequency being accumulated at the resonator is outputted after matching an output impedance to a predetermined impedance, so the voltage-controlled oscillator of this embodiment consumes less power and is capable of efficiently supplying a large signal power to the circuit of a subsequent stage.

Embodiment 3

A third embodiment of the present invention is explained with reference to FIG. 5. A voltage-controlled oscillator of this embodiment comprises a differential alternating current generator 20 including a resonator 10, for generating two-phase alternating current having the same frequency with the resonant frequency of the resonator 10 yet being 180 degrees out of phase; and a pair of transformers 31 and 32, each having a primary inductor connected to the differential alternating current generator 20 and a secondary inductor connected to an impedance-matching circuit 40. The impedance-matching circuit 40 is connected serially to the secondary inductors of the transformers 31 and 32.

Figure 5:
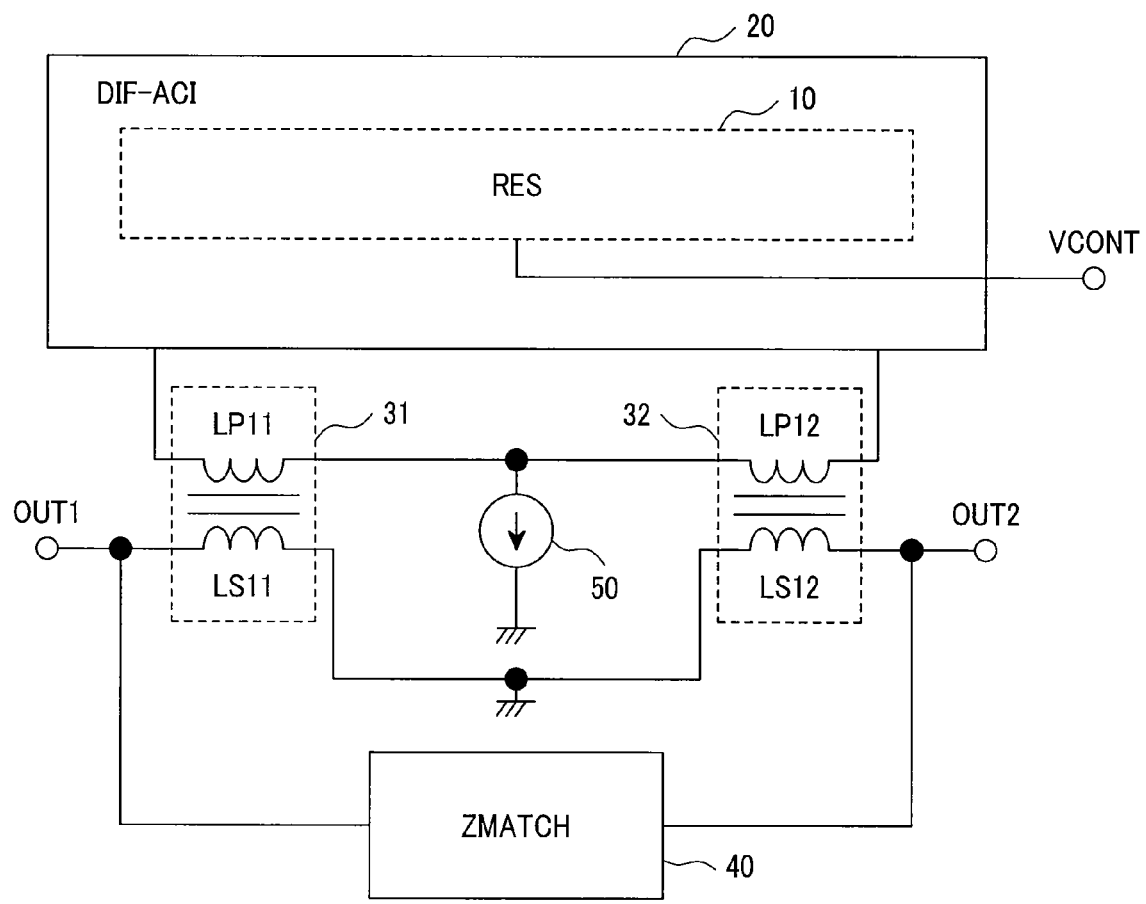
FIG. 5 is a schematic diagram of a voltage-controlled oscillator according to a third embodiment of the present invention.

With the configuration shown in FIG. 5, signal power of the oscillation frequency being accumulated at the resonator is outputted after matching an output impedance to a predetermined impedance, so the voltage-controlled oscillator of this embodiment consumes less power and is capable of efficiently supplying a large signal power to the circuit of a subsequent stage. An impedance (Zout) as the oscillator side is seen by an output terminal may be expressed by the following equation 3.

$$Zout = 1 \Big/ \left\{ 1/Z_2 + 1 \Big/ \left( j\omega L_2 + \frac{\omega^2 M^2}{Z_1 + j\omega L_1} \right) \right\} \quad (3)$$

In the equation (1) discussed earlier, impedance matching was realized only if $\omega L_1$ was sufficiently larger than $Z_1$. However, according to the equation (3), a simple addition of $Z_2$ can correct the impedance that could not be matched by the transformer alone, so impedance matching is realized even at a high frequency.

For instance, suppose that $Z_1=200\Omega$ needs to be converted into $Z_{OUT}=50\Omega$ at 60 GHz. Given that $L_1=500$ pH, $L_2=400$ pH, and M=300 pH, the $2^{nd}$ term in the denominator on the right side of the equation (3) is equal to $(0.0022-0.0078\text{ j})S$ (S: siemens). Therefore, the output impedance can be set to $50\Omega$ by using an impedance element with $Z_2=(0.0178+0.0078\text{ j})S$. Besides, since the impedance-matching circuit 40 is connected in parallel with the secondary inductors of the transformers 31 and 32, parasitic capacitor of lines forming the transformers can be utilized as a part of impedance matching.

Embodiment 4

Figure 6:
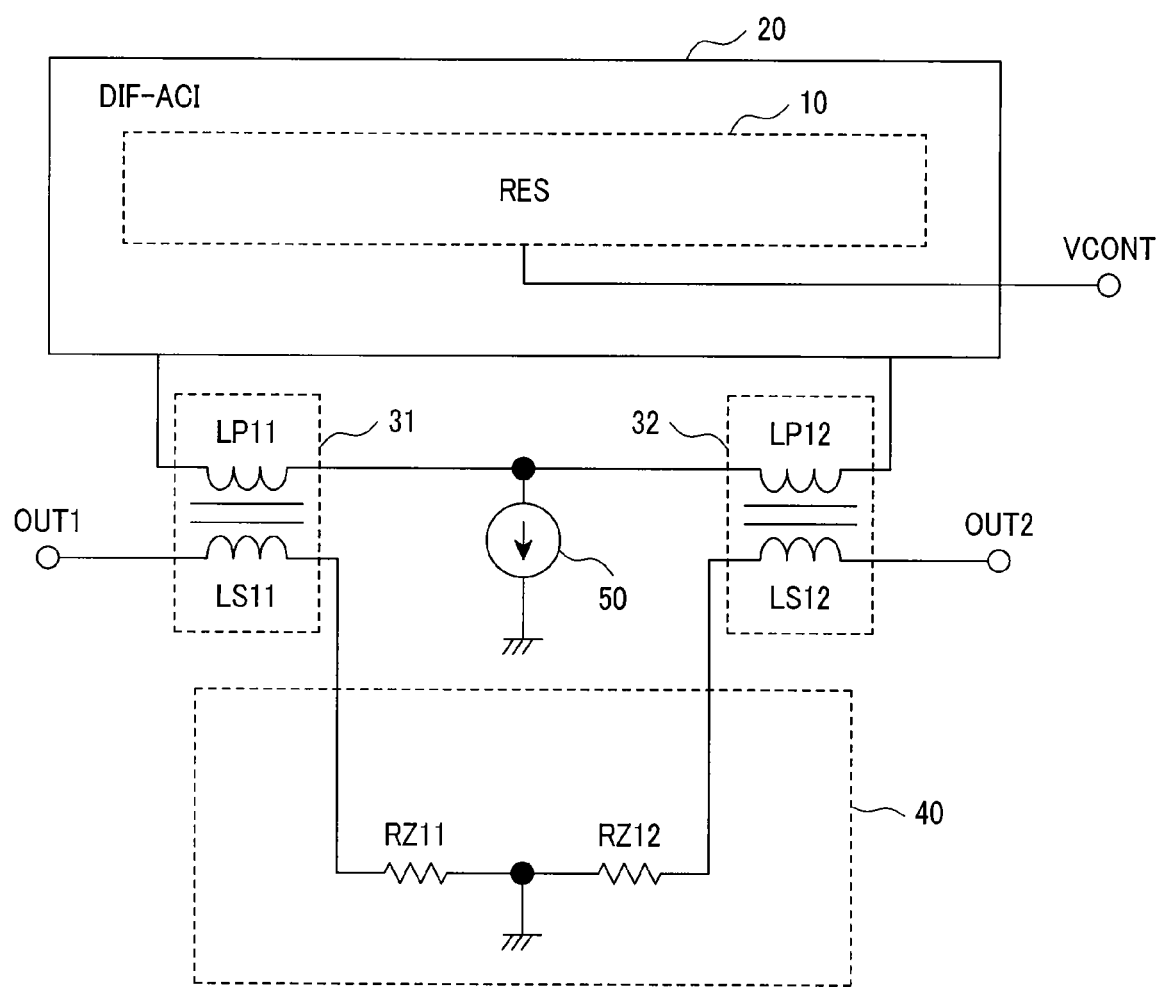
FIG. 6 is a schematic diagram of a voltage-controlled oscillator according to a fourth embodiment of the present invention.

A fourth embodiment of the present invention is explained with reference to FIG. 6. A voltage-controlled oscillator of this embodiment comprises a differential alternating current generator 20 including a resonator 10, for generating two-phase alternating current having the same frequency with the resonant frequency of the resonator 10 yet being 180 degrees out of phase; and transformers 31 and 32, each having a primary inductor connected to the differential alternating current generator 20 and a secondary inductor connected to an impedance-matching circuit 40. The impedance-matching circuit 40 is composed of resistors RZ11 and RZ12 and connected serially to the secondary inductors of the transformers 31 and 32, respectively. Since the impedance-matching circuit is composed of resistors only, its occupied area can be made small. With this configuration, signal power of the oscillation frequency being accumulated at the resonator is outputted after matching an output impedance to a predetermined impedance, so the voltage-controlled oscillator of this embodiment consumes less power and is capable of efficiently supplying a large signal power to the circuit of a subsequent stage.

Embodiment 5

Figure 7:
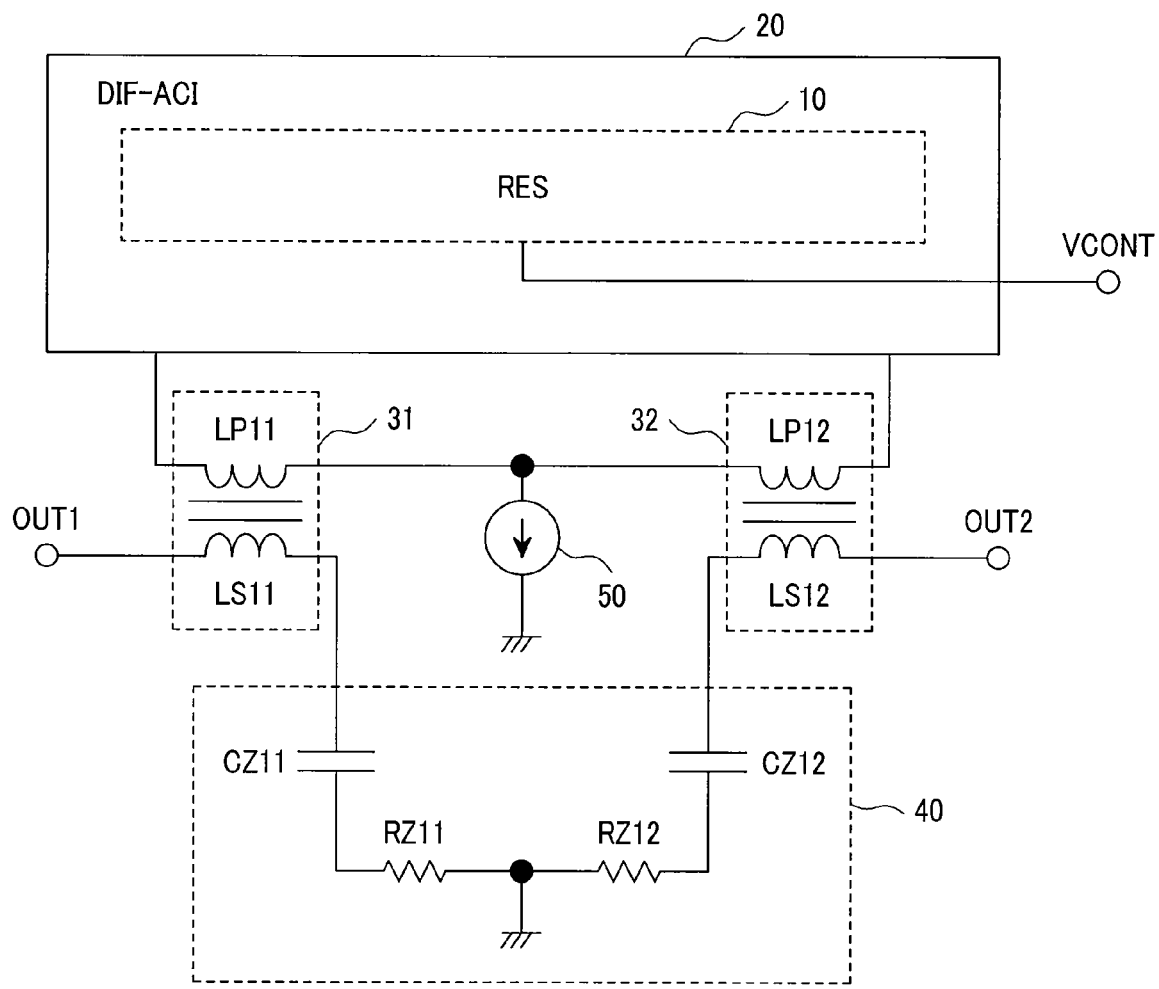
FIG. 7 is a schematic diagram of a voltage-controlled oscillator according to a fifth embodiment of the present invention.

A fifth embodiment of the present invention is explained with reference to FIG. 7. In a voltage-controlled oscillator of this embodiment, an impedance-matching circuit 40 is composed of a serial circuit including resistors RZ11 and RZ12 and capacitors CZ11 and CZ12, and secondary inductors of transformers 31 and 32 are connected serially to the impedance-matching circuit 40. With this configuration, signal power of the oscillation frequency being accumulated at the resonator is outputted after matching an output impedance to a predetermined impedance, so the voltage-controlled oscillator of this embodiment consumes less power and is capable of efficiently supplying a large signal power to the circuit of a subsequent stage.

For instance, suppose that $Z_1=200\Omega$ needs to be converted into $Z_{OUT}=50\Omega$ at 60 GHz. Given that $L_1=500$ pH, $L_2=400$ pH, and M=300 pH, sum of the $2^{nd}$ term and $3^{rd}$ term on the right side of the equation (2) is equal to $(34+120\,j)\Omega$. Therefore, the output impedance can be set to $50\Omega$ by using an impedance element with $Z_2=(16-120\,j)$S. Therefore, the output impedance can be set to $50\Omega$ by setting RZ11 and RZ12 to $16\Omega$, and CZ11 and CZ12 to 22 fF. By including not only resistors but also capacitors as the reactance elements in the impedance-matching circuit, even an imaginary part of the output impedance can be matched. Compared with the impedance-matching circuit of FIG. 6 including resistors only, the impedance-matching circuit of this embodiment enables more accurate matching.

Embodiment 6

Figure 8:
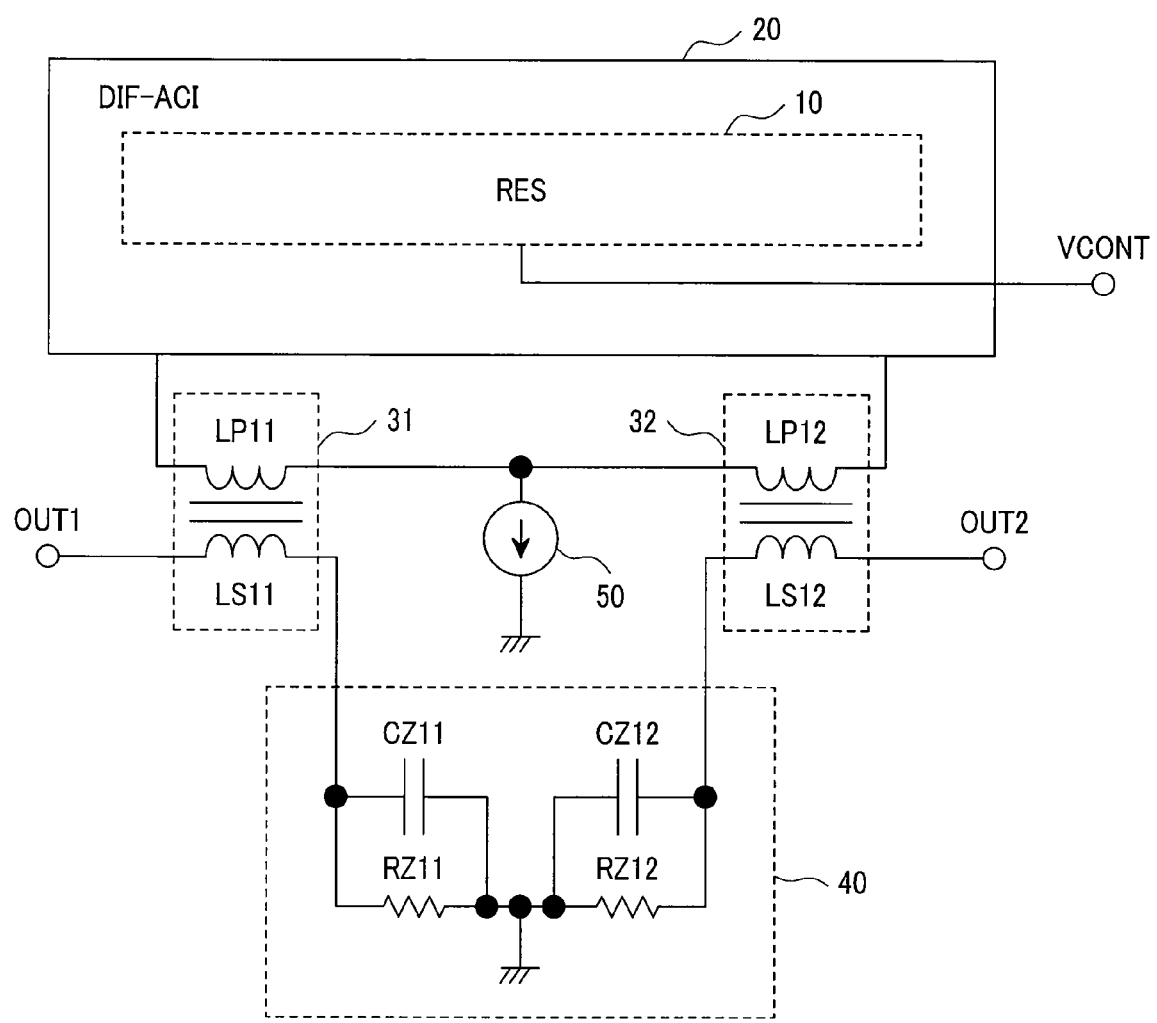
FIG. 8 is a schematic diagram of a voltage-controlled oscillator according to a sixth embodiment of the present invention.

A sixth embodiment of the present invention is explained with reference to FIG. 8. In a voltage-controlled oscillator of this embodiment, an impedance-matching circuit 40 is composed of a parallel circuit including resistors RZ11 and RZ12 and capacitors CZ11 and CZ12, and connected serially to the secondary inductors of transformers 31 and 32. With this configuration, signal power of the oscillation frequency being accumulated at the resonator is outputted after matching an output impedance to a predetermined impedance, so the voltage-controlled oscillator of this embodiment consumes less power and is capable of efficiently supplying a large signal power to the circuit of a subsequent stage.

For instance, suppose that $Z_1=200\Omega$ needs to be converted into $Z_{OUT}=50\Omega$ at 60 GHz. Given that $L_1=500$ pH, $L_2=400$ pH, and M=300 pH, sum of the $2^{nd}$ term and $3^{rd}$ term on the right side of the equation (2) is equal to $(34+120\,j)\Omega$. Therefore, the output impedance can be set to $50\Omega$ by using an impedance element with $Z_2=(16-120\,j)$S. Therefore, the output impedance can be set to $50\Omega$ by setting RZ11 and RZ12 to $900\Omega$ and CZ11 and CZ12 to 22 fF. By including not only resistors but also capacitors as the reactance elements in the impedance-matching circuit, even an imaginary part of the output impedance can be matched. Compared with the impedance-matching circuit of FIG. 6 including resistors only, the impedance-matching circuit of this embodiment enables more accurate matching.

Embodiment 7

A seventh embodiment of the present invention is explained with reference to FIG. 9. In a voltage-controlled oscillator of this embodiment, an impedance-matching circuit 40 is composed of a serial circuit including resistors RZ11 and RZ12 and capacitors CZ11 and CZ12, and secondary inductors of transformers 31 and 32 are connected in parallel with the impedance-matching circuit 40.

Figure 9:
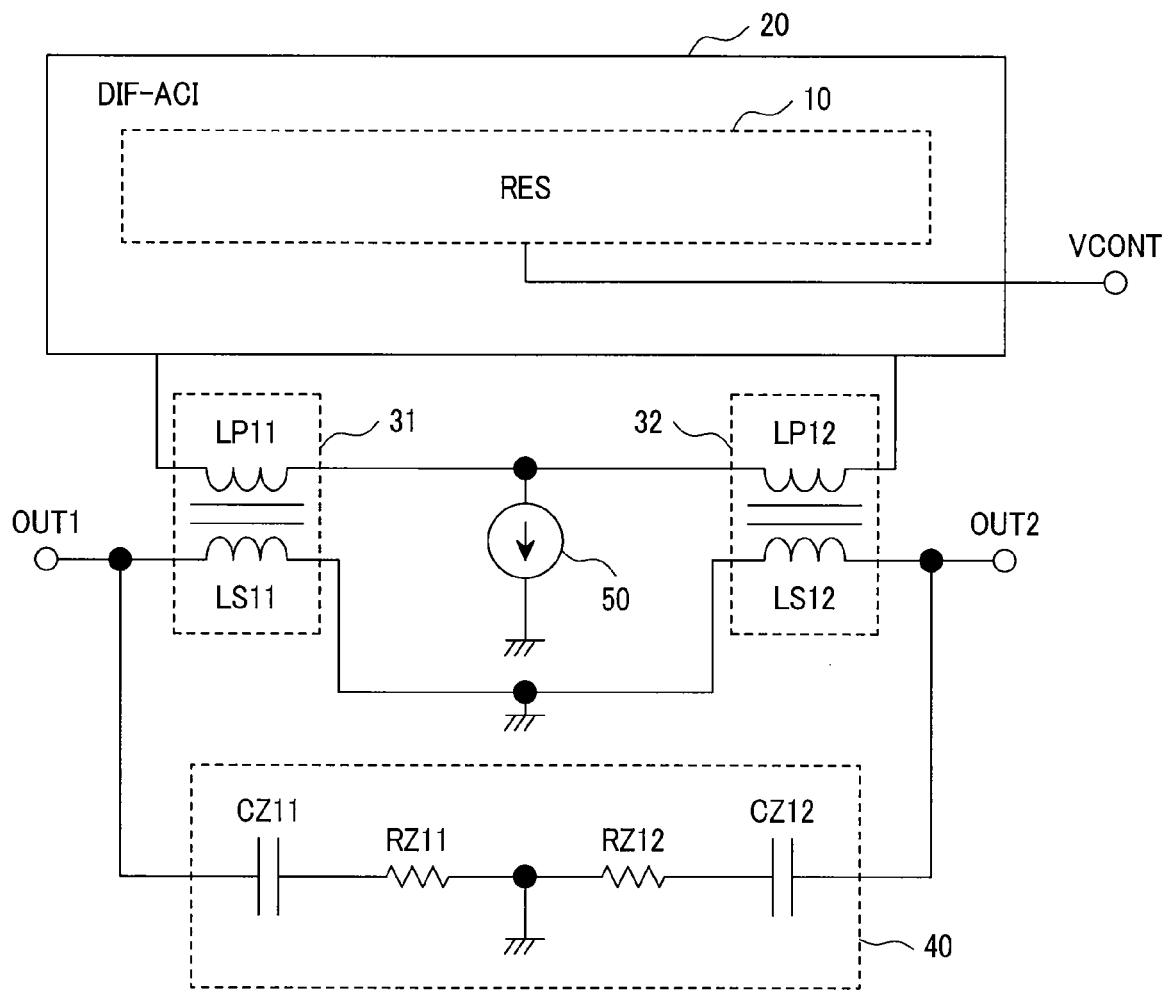
FIG. 9 is a schematic diagram of a voltage-controlled oscillator according to a seventh embodiment of the present invention.

With the configuration shown in FIG. 9, signal power of the oscillation frequency being accumulated at the resonator is outputted after matching an output impedance to a predetermined impedance, so the voltage-controlled oscillator of this embodiment consumes less power and is capable of efficiently supplying a large signal power to the circuit of a subsequent stage.

For instance, suppose that $Z_1=200\Omega$ needs to be converted into $Z_{OUT}=50\Omega$ at 60 GHz. Given that $L_1=500$ pH, $L_2=400$ pH, and M=300 pH, the $2^{nd}$ term in the denominator on the right side of the equation (2) is equal to $(0.0022-0.0078\,j)$S. Therefore, the output impedance can be set to $50\Omega$ by using an impedance element with $Z_2=(0.0178+0.0078\,j)$S. That is, the output impedance can be set to $50\Omega$ by setting RZ11 and RZ12 to $47\Omega$ and CZ11 and CZ12 to 130 fF. Since the impedance-matching circuit 40 is connected in parallel with the secondary inductors of the transformers 31 and 32, parasitic capacitor of lines forming the transformers can be suitably utilized as a part of impedance matching.

Embodiment 8

An eighth embodiment of the present invention is explained with reference to FIG. 10. In a voltage-controlled oscillator of this embodiment, an impedance-matching circuit 40 is composed of a parallel circuit including resistors RZ11 and RZ12 and capacitors CZ11 and CZ12, and connected serially to the secondary inductors of transformers 31 and 32.

Figure 10:
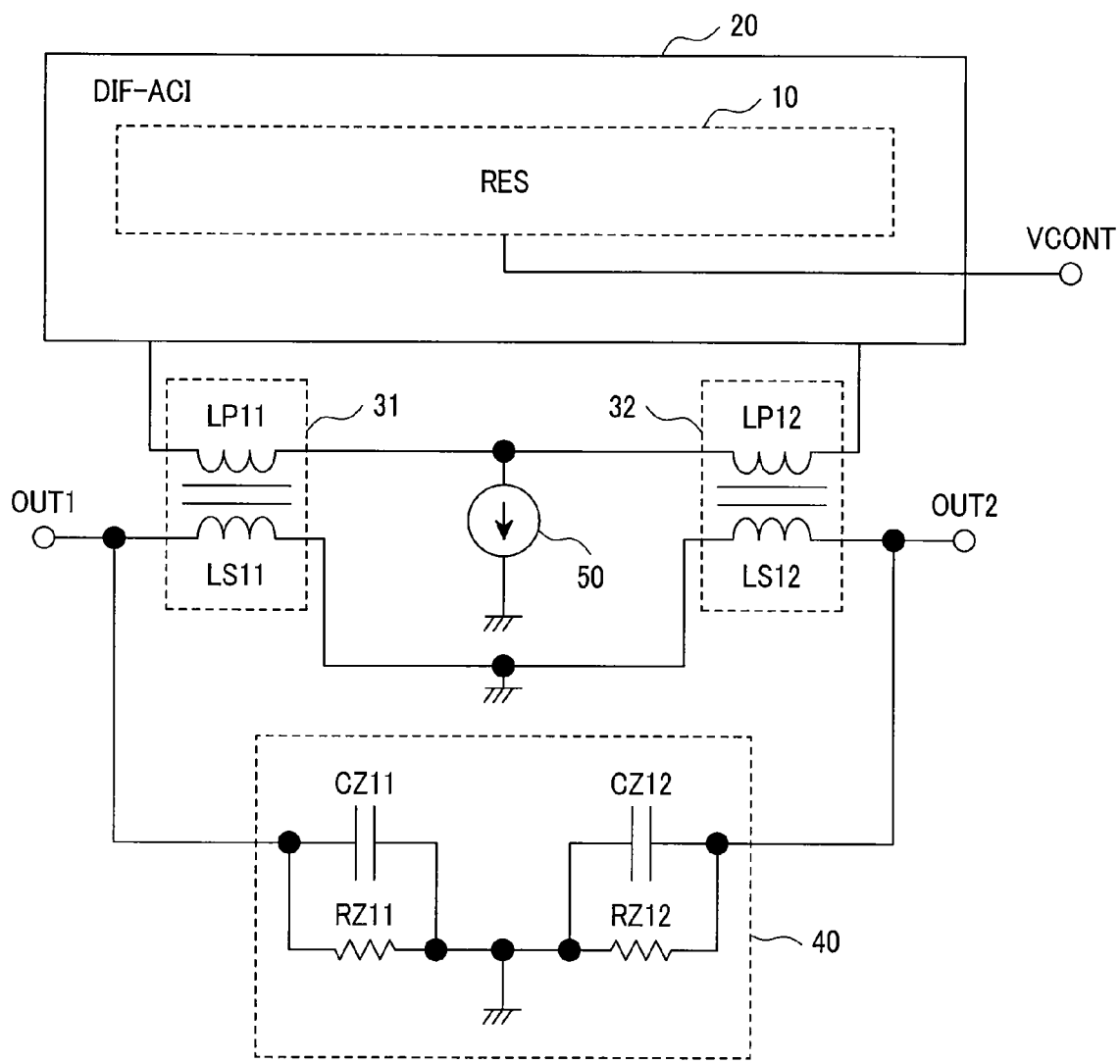
FIG. 10 is a schematic diagram of a voltage-controlled oscillator according to an eighth embodiment of the present invention.

With the configuration shown in FIG. 10, signal power of the oscillation frequency being accumulated at the resonator is outputted after matching an output impedance to a predetermined impedance, so the voltage-controlled oscillator of this embodiment consumes less power and is capable of efficiently supplying a large signal power to the circuit of a subsequent stage.

For instance, suppose that $Z_1=200\Omega$ needs to be converted into $Z_{OUT}=50\Omega$ at 60 GHz. Given that $L_1=500$ pH, $L_2=400$ pH, and M=300 pH, the $2^{nd}$ term in the denominator on the right side of the equation (2) is equal to $(0.0022-0.0078\,j)$S. Therefore, the output impedance can be set to $50\Omega$ by using an impedance element with $Z_2=(0.0178+0.0078\,j)$S. That is, the output impedance can be set to $50\Omega$ by setting RZ11 and RZ12 to $47\Omega$ and CZ11 and CZ12 to 22 fF. Since the impedance-matching circuit 40 is connected in parallel with the secondary inductors of the transformers 31 and 32, parasitic capacitor of lines forming the transformers can be utilized as a part of impedance matching.

Embodiment 9

A ninth embodiment of the present invention is explained with reference to FIG. 11. A voltage-controlled oscillator of this embodiment comprises a differential alternating current generator 20 including a resonator 10, for generating two-phase alternating current having the same frequency with the resonant frequency of the resonator 10 yet being 180 degrees out of phase; and transformers 31 and 32, each having a primary inductor LP11, LP12 connected to the differential alternating current generator 20 and a secondary inductor LS11, LS12 connected to an impedance-matching circuit 40. The impedance-matching circuit 40 includes resistors or capacitors, or both resistors and capacitors. The resonator 10 includes inductors L11 and L12 and capacitance turnable capacitors CV11 and CV12, and the resonant frequency can be varied by changing the capacitance of CV11 and CV12 with a control voltage $V_{CONT}$.

Figure 11:
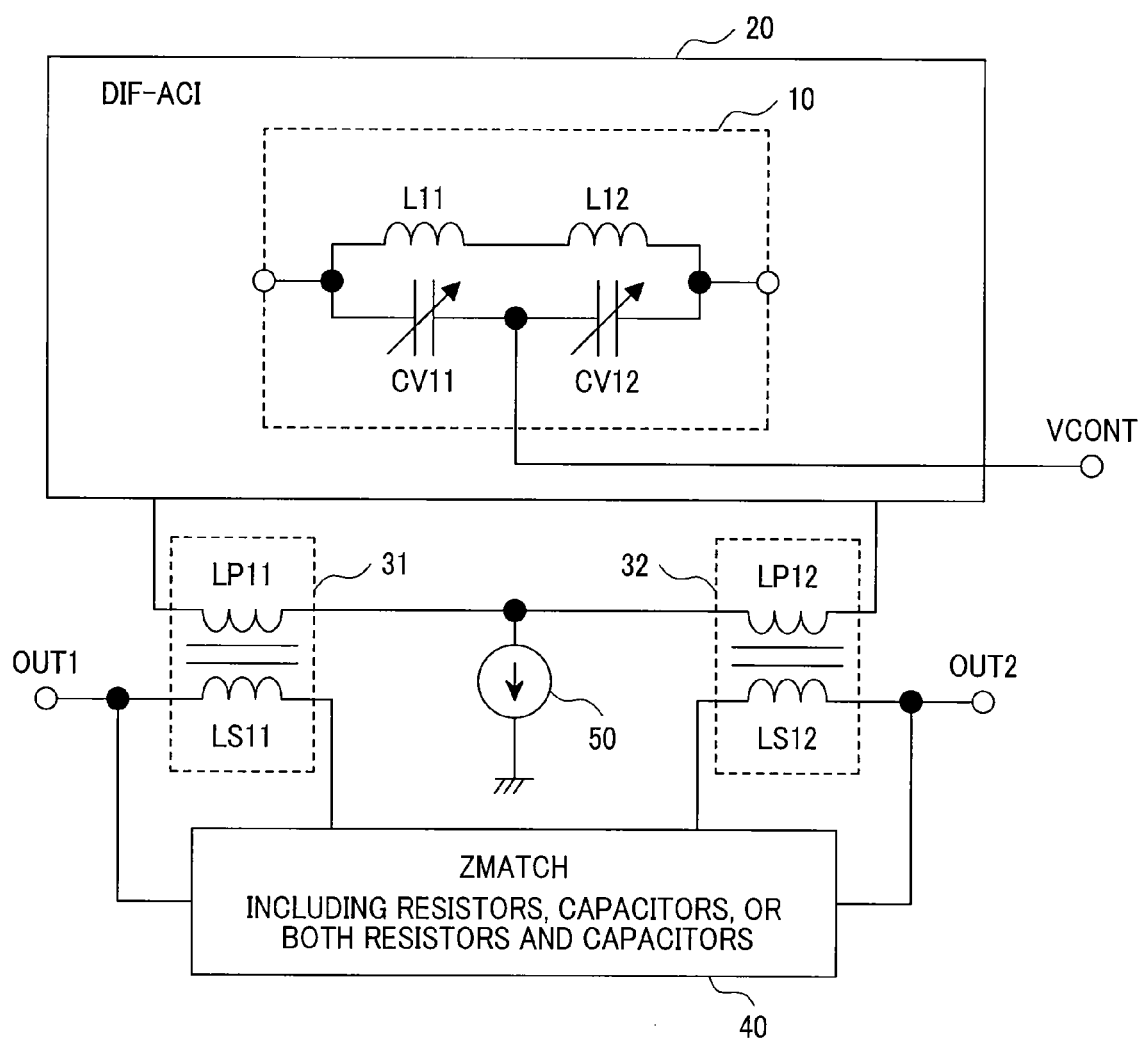
FIG. 11 is a schematic diagram of a voltage-controlled oscillator according to a ninth embodiment of the present invention.

With the configuration shown in FIG. 11, signal power of the oscillation frequency being accumulated at the resonator is outputted after matching an output impedance to a predetermined impedance, so the voltage-controlled oscillator of this embodiment consumes less power and is capable of efficiently supplying a large signal power to the circuit of a subsequent stage. In addition, by configuring the resonator with inductors and capacitors, the resonator may be arranged on an integrated circuit with other elements and an external resonator is therefore not required. Consequently, the manufacturing cost of the voltage-controlled oscillator can be reduced.

Embodiment 10

A tenth embodiment of the present invention is explained with reference to FIG. 12. A voltage-controlled oscillator of this embodiment comprises a differential alternating current generator 20 including a resonator 10, for generating two-phase alternating current having the same frequency with the resonant frequency of the resonator 10 yet being 180 degrees out of phase; and transformers 31 and 32, each having a primary inductor LP11, LP12 connected to the differential alternating current generator 20 and a secondary inductor LS11, LS12 connected to an impedance-matching circuit 40. The impedance-matching circuit 40 includes resistors or capacitors, or both resistors and capacitors. The resonator 10 and the differential alternating current generator 20 have a typical differential Colpitts type circuitry. The resonator 10 includes inductors L11 and L12, fixed capacitors CO1 and CO2, and capacitance turnable capacitors CV11 and CV12, and the resonant frequency can be varied by changing the capacitance of CV11 and CV12 with a control voltage $V_{CONT}$. Transistors composing the differential Colpitts type circuit are bipolar transistors Q1 and Q2. The primary inductor LP11, LP12 of the transformers 31 and 32 are connected to emitters of the bipolar transistors Q1 and Q2. Also, a supply voltage is applied to the collectors of the bipolar transistors Q1 and Q2 through supply voltage terminals (the $2^{nd}$ voltage terminal) V1, while a bias voltage is applied to the bases from the bias voltage terminal (the $1^{st}$ voltage terminal) VB1 through the inductors L11 and L12.

Figure 12:
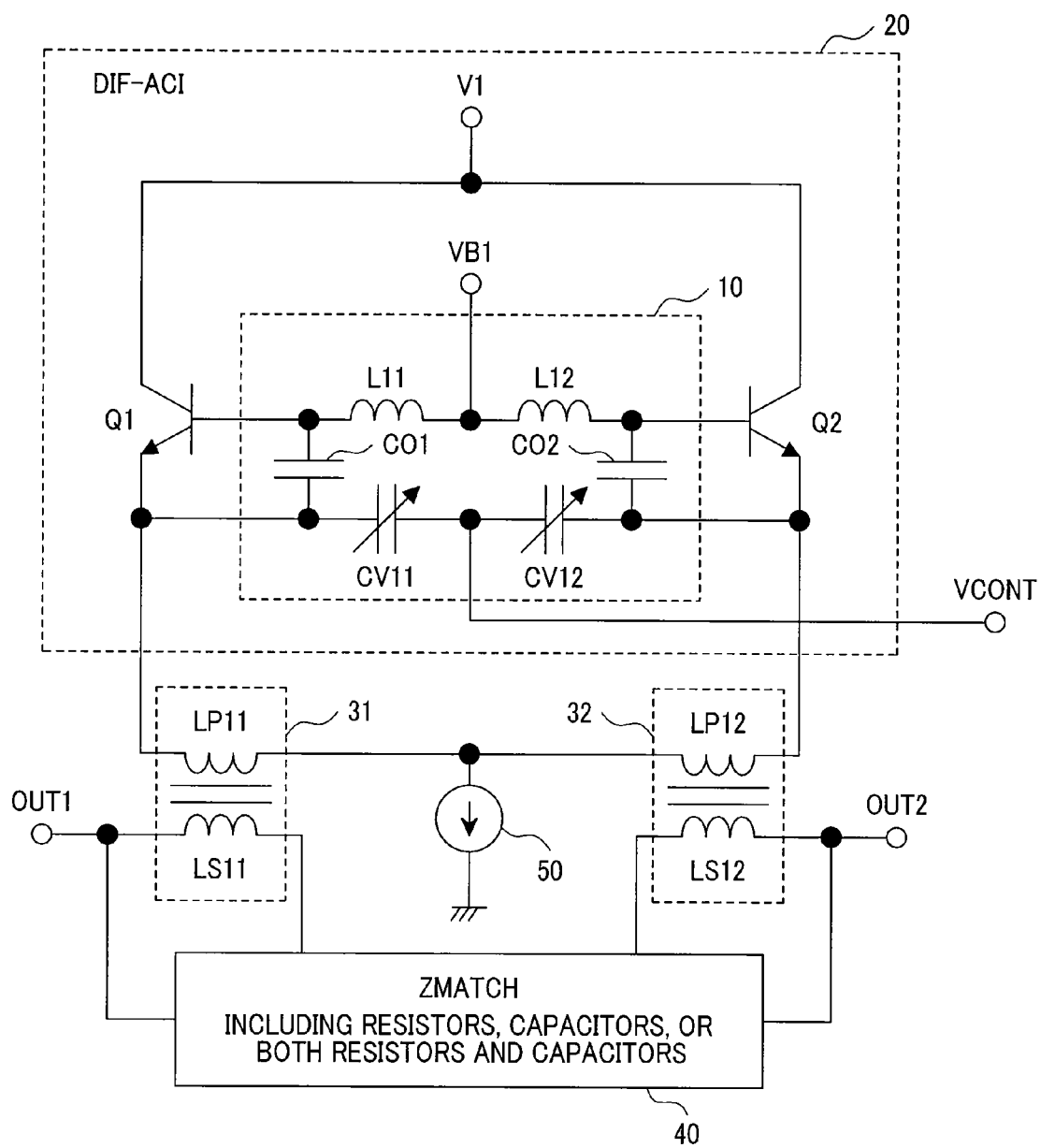
FIG. 12 is a schematic diagram of a voltage-controlled oscillator according to a tenth embodiment of the present invention.

With the configuration shown in FIG. 12, signal power of the oscillation frequency being accumulated at the resonator 10 is outputted after matching an output impedance to a predetermined impedance, so the voltage-controlled oscillator of this embodiment consumes less power and is capable of efficiently supplying a large signal power to the circuit of a subsequent stage. Also, the use of a differential Colpitts type circuitry enables to take out a differential alternating current. Moreover, because the base and the emitter of the bipolar transistor Q1 and the base and the emitter of the bipolar transistor Q2 are voltage signals of approximately the same phase, respectively, an increase in capacitance due to the mirror effect is small. Furthermore, as in a conventional circuit configuration, the primary inductors LP11 and LP12 of the transformers 31 and 32 in this embodiment also serve to isolate differential signals, so that output signals may be outputted, without any need to increase the size of the voltage-controlled oscillator. In addition, by configuring the resonator with inductors and capacitors, the resonator may be arranged on an integrated circuit with other elements and an external resonator is therefore not required. Consequently, the manufacturing cost of the voltage-controlled oscillator can be reduced.

The impedance-matching circuit 40 is connected serially to the secondary inductors of the transformers 31 and 32 for example. With this configuration, signal power of the oscillation frequency being accumulated at the resonator is outputted after matching an output impedance to a predetermined impedance, so the voltage-controlled oscillator of this embodiment consumes less power and is capable of efficiently supplying a large signal power to the circuit of a subsequent stage.

Moreover, the impedance-matching circuit 40 may be connected in parallel with the secondary inductors of the transformers 31 and 32. This configuration also exerts the same effect, that is, signal power of the oscillation frequency being accumulated at the resonator is outputted after matching an output impedance to a predetermined impedance, so the voltage-controlled oscillator of this embodiment consumes less power and is capable of efficiently supplying a large signal power to the circuit of a subsequent stage. Furthermore, by connecting the impedance-matching circuit 40 in parallel with the secondary inductors of the transformers 31 and 32, parasitic capacitor of lines forming the transformers can be suitably utilized as a part of impedance matching.

Table 1 below illustrates an example of the experiment results of a comparison between properties of an embodiment of the present invention and properties of conventional ones. A conventional scheme 1 adopts the output system disclosed in the above "SiGe BiCMOS 65-GHz BPSK Transmitter and 30 to 122 GHz LC-Varactor VCOs with up to 21% Tuning Range," in which a cascode amplifier is connected to a transistor collector included in a resonator, and an impedance-matching circuit is provided to a collector of the cascode amplifier, thereby taking out an output from the collector. The conventional scheme 2 adopts the output system disclosed in the above "Fully Integrated SiGe VCOs with Powerful Output Buffer for 77-GHz Automotive Radar Systems and Applications around 100 GHz," in which an output is taken out from a driver amplifier connected to a rear stage of a resonator. According to an exemplary scheme of the present invention, it takes 3.3V supply voltage and 42 mA of current consumption to attain equivalent performance to the conventional scheme 1 or 2, and power consumption was cut down largely by approximately 22%.

TABLE 1

| Item | Conventional Scheme 1 | Conventional Scheme 2 | Inventive Scheme |
|---|---|---|---|
| Supply voltage (V) | 4.5 | 3.3 | 3.3 |
| Current consumption (mA) | 40 | 60 | 42 |
| Power consumption (mW) | 180 | 198 | 139 |
| Output (dBm) | 0 | 0 | 0 |

Embodiment 11

An eleventh embodiment of the present invention is explained with reference to FIG. 13. A voltage-controlled oscillator of this embodiment comprises a differential alternating current generator 20 including a resonator 10, for generating two-phase alternating current having the same frequency with the resonant frequency of the resonator 10 yet being 180 degrees out of phase; and transformers 31 and 32, each having a primary inductor LP11, LP12 connected to the differential alternating current generator 20 and a secondary inductor LS11, LS12 connected to an impedance-matching circuit 40. The impedance-matching circuit 40 includes resistors or capacitors, or both resistors and capacitors. The resonator 10 and the differential alternating current generator 20 have a typical differential Colpitts type circuitry. The resonator 10 includes inductors L11 and L12, fixed capacitors CO1 and CO2, and capacitance turnable capacitors CV11 and CV12, and the resonant frequency can be varied by changing the capacitance of CV11 and CV12 with a control voltage $V_{CONT}$. Transistors composing the differential Colpitts type circuit are MOS transistors M1 and M2. The primary inductor LP11, LP12 of the transformers 31 and 32 are connected to sources of the MOS transistors M1 and M2.

Figure 13:
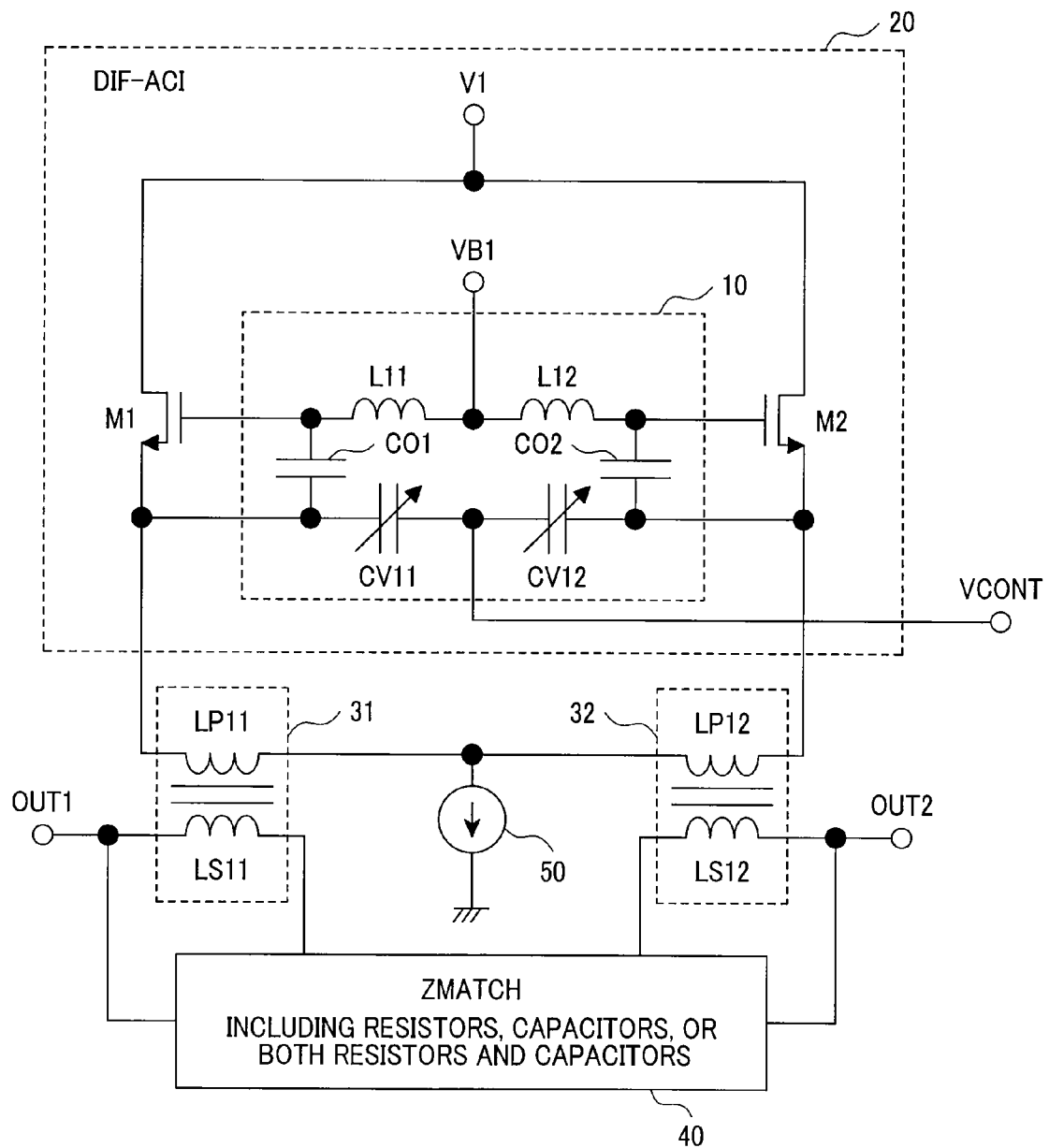
FIG. 13 is a schematic diagram of a voltage-controlled oscillator according to an eleventh embodiment of the present invention.

With the configuration shown in FIG. 13, signal power of the oscillation frequency being accumulated at the resonator 10 is outputted after matching an output impedance to a predetermined impedance, so the voltage-controlled oscillator of this embodiment consumes less power and is capable of efficiently supplying a large signal power to the circuit of a subsequent stage. The use of a differential Colpitts type circuitry enables to take out a differential alternating current. In addition, by configuring the resonator with inductors and capacitors, the resonator may be arranged on an integrated circuit with other elements and an external resonator is therefore not required. Consequently, the manufacturing cost of the voltage-controlled oscillator can be reduced. Also, the MOS transistors operate at a lower supply voltage than the bipolar transistors used in Embodiment 12, so a power consumption reducing effect can be realized.

The impedance-matching circuit 40 is connected serially to the secondary inductors of the transformers 31 and 32 for example. With this configuration, signal power of the oscillation frequency being accumulated at the resonator is outputted after matching an output impedance to a predetermined impedance, so the voltage-controlled oscillator of this embodiment consumes less power and is capable of efficiently supplying a large signal power to the circuit of a subsequent stage.

Moreover, the impedance-matching circuit 40 may be connected in parallel with the secondary inductors of the transformers 31 and 32. This configuration also exerts the same effect, that is, signal power of the oscillation frequency being accumulated at the resonator is outputted after matching an output impedance to a predetermined impedance, so the voltage-controlled oscillator of this embodiment consumes less power and is capable of efficiently supplying a large signal power to the circuit of a subsequent stage. Furthermore, parasitic capacitor of lines forming the transformers can be utilized as a part of impedance matching.

Embodiment 12

A twelfth embodiment of the present invention is explained with reference to FIG. 14. A voltage-controlled oscillator of this embodiment comprises a differential alternating current generator 20 including a resonator 10, for generating two-phase alternating current having the same frequency with the resonant frequency of the resonator 10 yet being 180 degrees out of phase; and transformers 31 and 32, each having a primary inductor LP11, LP12 connected to the differential alternating current generator 20 and a secondary inductor LS11, LS12 connected to an impedance-matching circuit 40. The resonator 10 and the differential alternating current generator 20 have a typical differential Colpitts type circuitry. The resonator 10 includes inductors L11 and L12, fixed capacitors CO1 and CO2, and capacitance turnable capacitors CV11 and CV12, and the resonant frequency can be varied by changing the capacitance of CV11 and CV12 with a control voltage $V_{CONT}$. Transistors composing the differential Colpitts type circuit are bipolar transistors Q1 and Q2. The primary inductor LP11, LP12 of the transformers 31 and 32 are connected to emitters of the bipolar transistors Q1 and Q2. The impedance-matching circuit 40 includes resistors RZ11 and RZ12 and is connected serially to the secondary inductors LS11, LS12 of the transformers 31 and 32.

An output impedance of the voltage-controlled oscillator is set to a predetermined impedance by adjusting resistances of the resistors RZ11 and RZ12. Since the impedance-matching circuit 40 is composed of resistors only, its occupied area can be made small.

Figure 14:
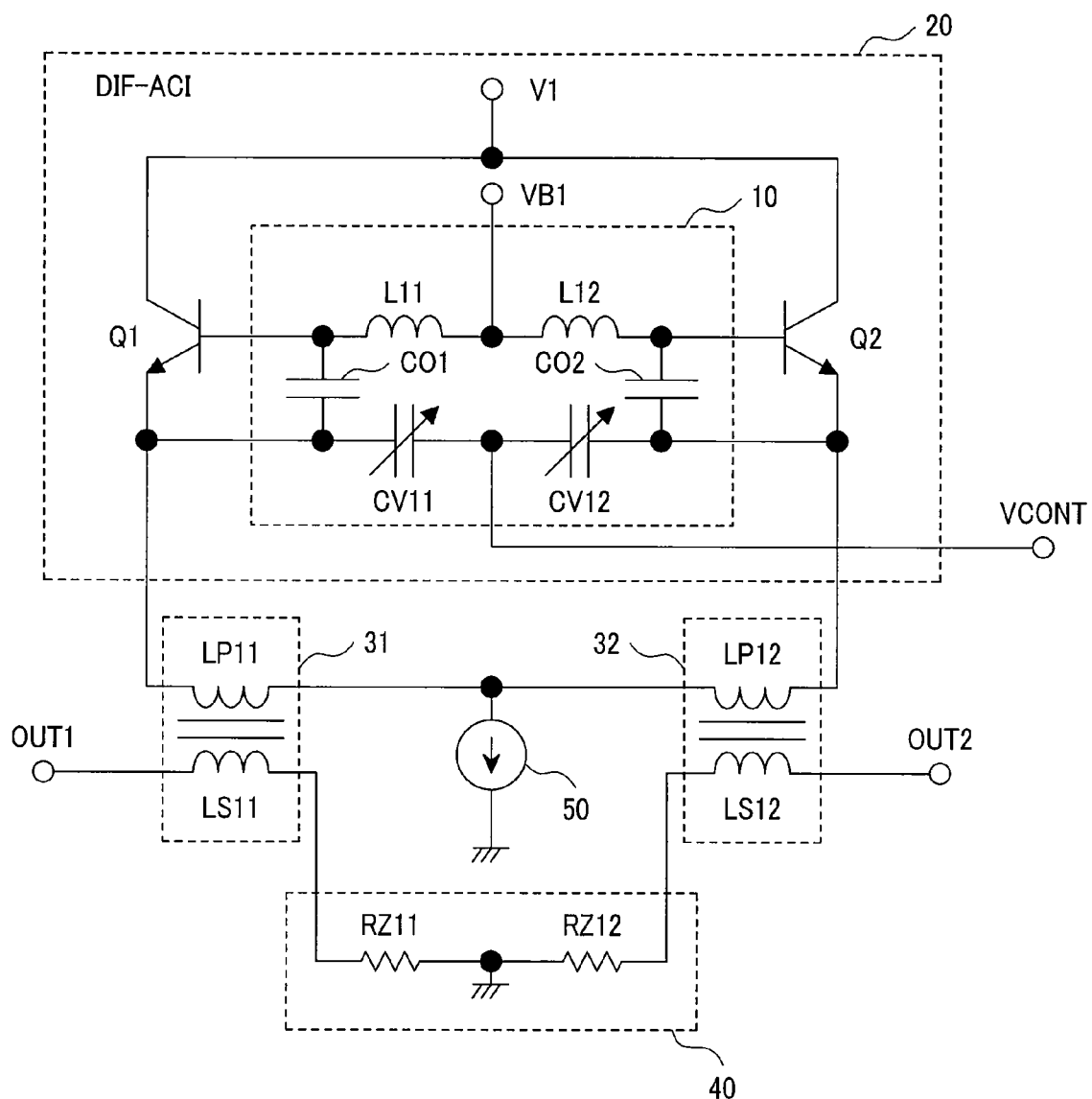
FIG. 14 is a schematic diagram of a voltage-controlled oscillator according to a twelfth embodiment of the present invention.

With the configuration shown in FIG. 14, signal power of the oscillation frequency being accumulated at the resonator is outputted after matching an output impedance to a predetermined impedance, so the voltage-controlled oscillator of this embodiment consumes less power and is capable of efficiently supplying a large signal power to the circuit of a subsequent stage. The use of a differential Colpitts type circuitry enables to take out a differential alternating current. In addition, by configuring the resonator with inductors and capacitors, the resonator may be arranged on an integrated circuit with other elements and an external resonator is therefore not required. Consequently, the manufacturing cost of the voltage-controlled oscillator can be reduced.

Embodiment 13

A thirteenth embodiment of the present invention is explained with reference to FIG. 15. A voltage-controlled oscillator of this embodiment comprises a differential alternating current generator 20 including a resonator 10, for generating two-phase alternating current having the same frequency with the resonant frequency of the resonator 10 yet being 180 degrees out of phase; and transformers 31 and 32, each having a primary inductor connected to the differential alternating current generator 20 and a secondary inductor connected to an impedance-matching circuit 40. The resonator 10 and the differential alternating current generator 20 have a typical differential Colpitts type circuitry. The resonator 10 includes inductors L11 and L12, fixed capacitors CO1 and CO2, and capacitance turnable capacitors CV11 and CV12, and the resonant frequency can be varied by changing the capacitance of CV11 and CV12 with a control voltage $V_{CONT}$. Transistors composing the differential Colpitts type circuit are MOS transistors M1 and M2. The primary inductor LP11, LP12 of the transformers 31 and 32 are connected to sources of the MOS transistors M1 and M2. The impedance-matching circuit 40 includes resistors RZ11 and RZ12 and is connected serially to the secondary inductors LS11, LS12 of the transformers 31 and 32.

An output impedance of the voltage-controlled oscillator is set to a predetermined impedance by adjusting resistances of the resistors RZ11 and RZ12. Since the impedance-matching circuit 40 is composed of resistors only, its occupied area can be made small.

Figure 15:
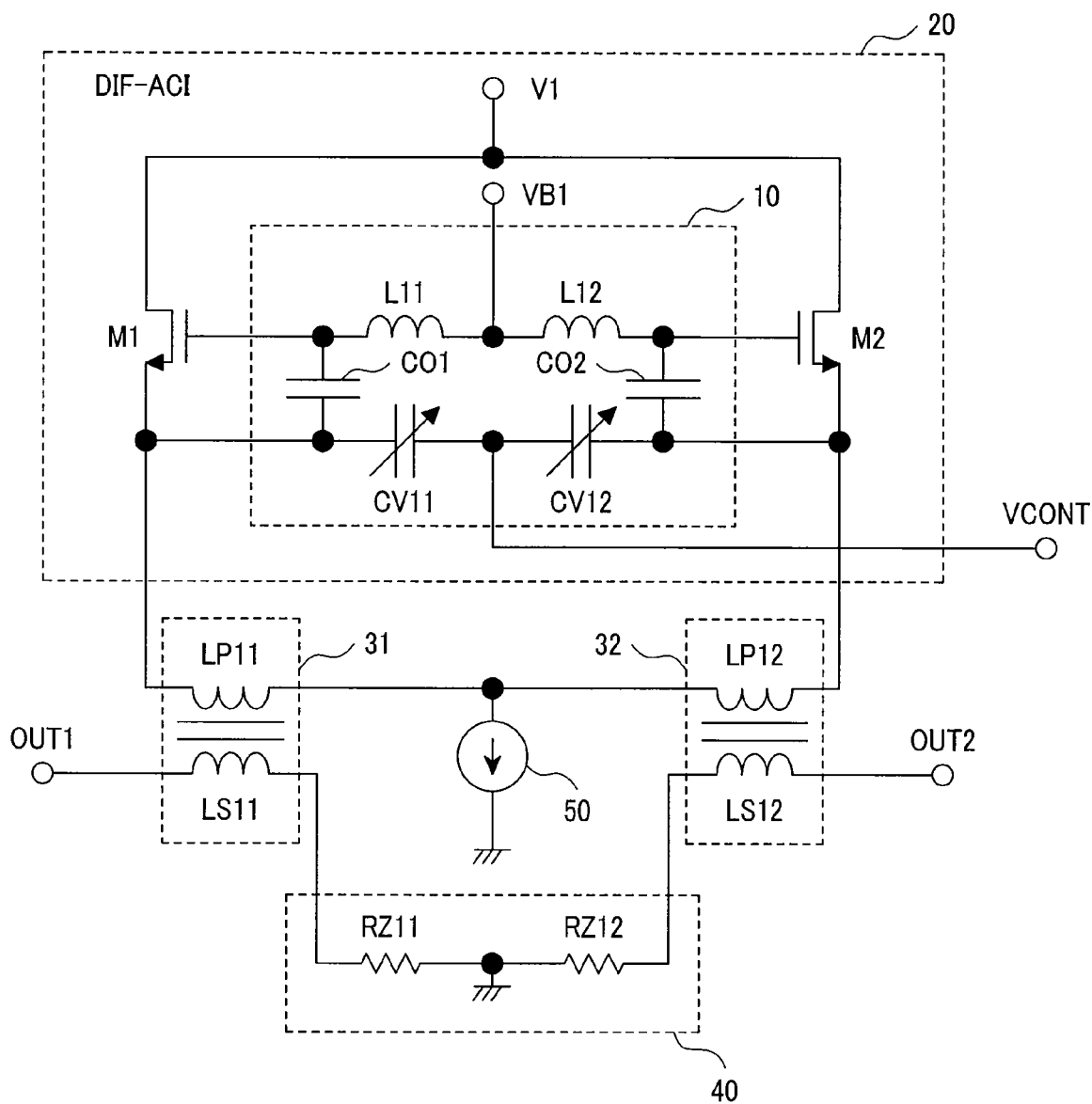
FIG. 15 is a schematic diagram of a voltage-controlled oscillator according to a thirteenth embodiment of the present invention.

With the configuration shown in FIG. 15, signal power of the oscillation frequency being accumulated at the resonator is outputted after matching an output impedance to a predetermined impedance, so the voltage-controlled oscillator of this embodiment consumes less power and is capable of efficiently supplying a large signal power to the circuit of a subsequent stage. The use of a differential Colpitts type circuitry enables to take out a differential alternating current. In addition, by configuring the resonator with inductors and capacitors, the resonator may be arranged on an integrated circuit with other elements and an external resonator is therefore not required. Consequently, the manufacturing cost of the voltage-controlled oscillator can be reduced. Also, the MOS transistors operate at a lower supply voltage than the bipolar transistors used in Embodiment 14, so a power consumption reducing effect can be realized.

Embodiment 14

A fourteenth embodiment of the present invention is explained with reference to FIG. 16. A voltage-controlled oscillator of this embodiment comprises a differential alternating current generator 20 including a resonator 10, for generating two-phase alternating current having the same frequency with the resonant frequency of the resonator 10 yet being 180 degrees out of phase; and transformers 31 and 32, each having a primary inductor connected to the differential alternating current generator 20 and a secondary inductor connected to an impedance-matching circuit 40. The resonator 10 and the differential alternating current generator 20 have a typical differential Colpitts type circuitry. The resonator 10 includes inductors L11 and L12, fixed capacitors CO1 and CO2, and capacitance turnable capacitors CV11 and CV12, and the resonant frequency can be varied by changing the capacitance of CV11 and CV12 with a control voltage $V_{CONT}$. Transistors composing the differential Colpitts type circuit are bipolar transistors Q1 and Q2. The primary inductor LP11, LP12 of the transformers 31 and 32 are connected to emitters of the bipolar transistors Q1 and Q2. The impedance-matching circuit 40 is composed of a serial circuit including resistors RZ11 and RZ12 and capacitors CZ11 and CZ12, and connected serially to the secondary inductors LS11, LS12 of the transformers 31 and 32. An output impedance of the voltage-controlled oscillator is set to a predetermined impedance by adjusting resistances of the resistors RZ11 and RZ12 and by adjusting capacitances of the capacitors CZ11 and CZ12.

Figure 16:
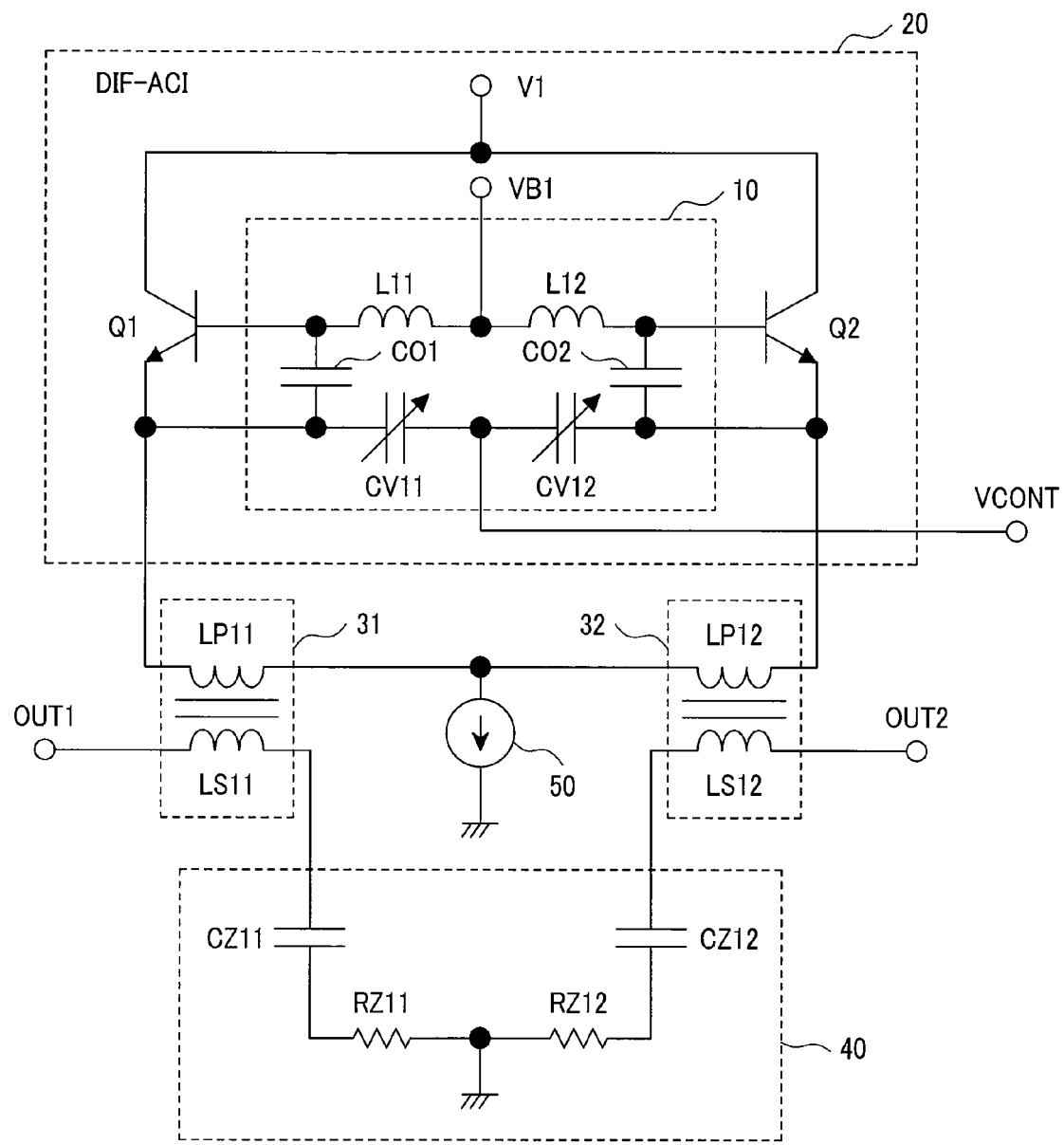
FIG. 16 is a schematic diagram of a voltage-controlled oscillator according to a fourteenth embodiment of the present invention.

With the configuration shown in FIG. 16, signal power of the oscillation frequency being accumulated at the resonator is outputted after matching an output impedance to a predetermined impedance, so the voltage-controlled oscillator of this embodiment consumes less power and is capable of efficiently supplying a large signal power to the circuit of a subsequent stage. The use of a differential Colpitts type circuitry enables to take out a differential alternating current. In addition, by configuring the resonator 10 with inductors and capacitors, the resonator may be arranged on an integrated circuit with other elements and an external resonator is therefore not required. Consequently, the manufacturing cost of the voltage-controlled oscillator can be reduced. By including not only resistors but also capacitors as the reactance elements in the impedance-matching circuit 40, even an imaginary part of the output impedance can be matched. Compared with the impedance-matching circuits of FIG. 14 and FIG. 15 including resistors only, the impedance-matching circuit of this embodiment enables more accurate matching.

Meanwhile, transistors composing the differential Colpitts type circuit may be MOS transistors M1 and M2. In this case, the transformers 31 and 32 are connected to sources of the MOS transistors M1 and M2, respectively. Since the MOS transistors operate at a lower supply voltage than the bipolar transistors, a low power consumption effect can be achieved.

Embodiment 15

A fifteenth embodiment of the present invention is explained with reference to FIG. 17. A voltage-controlled oscillator of this embodiment comprises a differential alternating current generator 20 including a resonator 10, for generating two-phase alternating current having the same frequency with the resonant frequency of the resonator 10 yet being 180 degrees out of phase; and transformers 31 and 32, each having a primary inductor connected to the differential alternating current generator 20 and a secondary inductor connected to an impedance-matching circuit 40. The resonator 10 and the differential alternating current generator 20 have a typical differential Colpitts type circuitry. The resonator 10 includes inductors L11 and L12, fixed capacitors CO1 and CO2, and capacitance turnable capacitors CV11 and CV12, and the resonant frequency can be varied by changing the capacitance of CV11 and CV12 with a control voltage $V_{CONT}$. Transistors composing the differential Colpitts type circuit are bipolar transistors Q1 and Q2. The transformers 31 and 32 are connected to emitters of the bipolar transistors Q1 and Q2. The impedance-matching circuit 40 is composed of a parallel circuit including resistors RZ11 and RZ12 and capacitors CZ11 and CZ12, and connected serially to the secondary inductors of the transformers 31 and 32. An output impedance of the voltage-controlled oscillator is set to a predetermined impedance by adjusting resistances of the resistors RZ11 and RZ12 and by adjusting capacitances of the capacitors CZ11 and CZ12.

Figure 17:
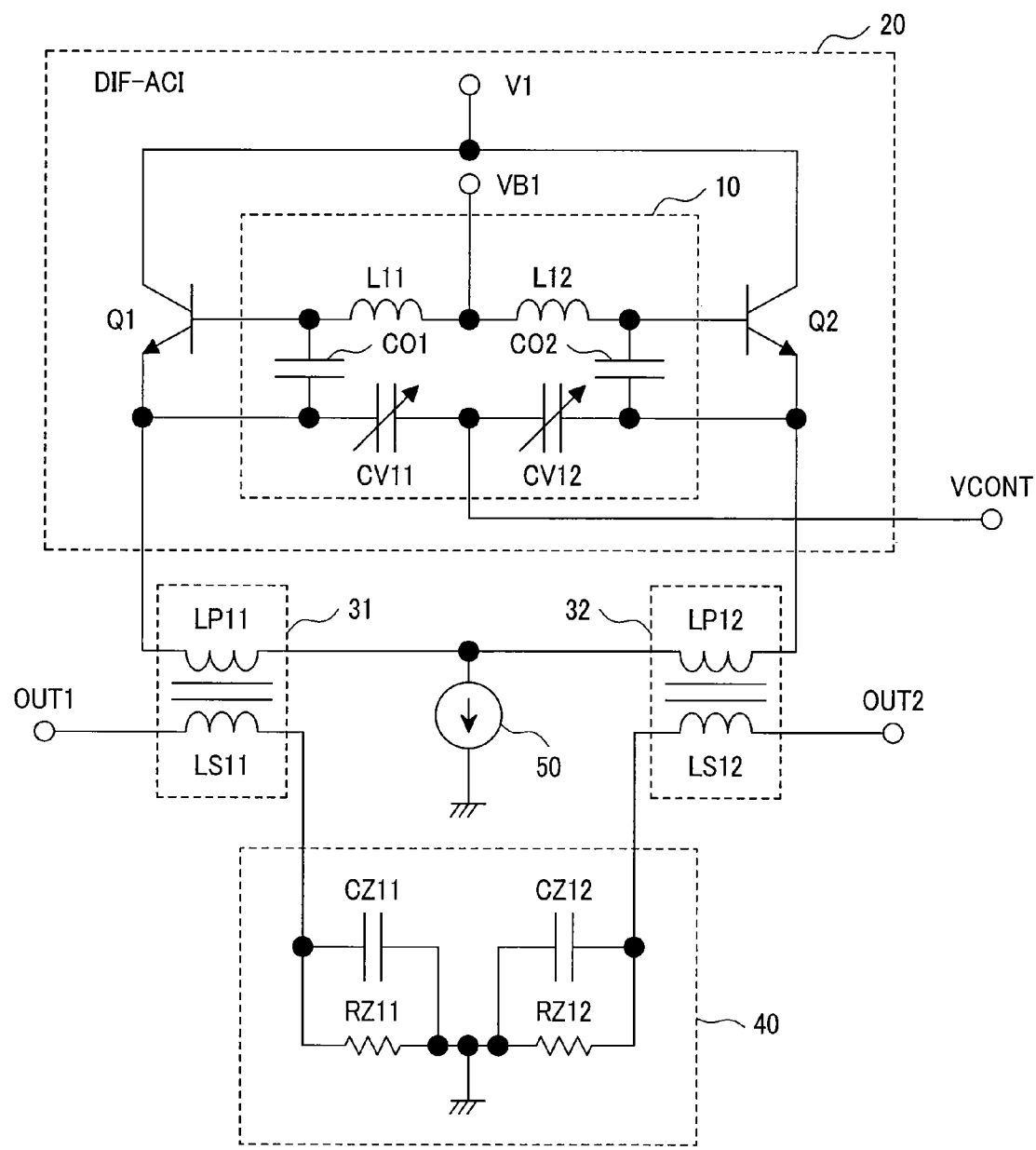
FIG. 17 is a schematic diagram of a voltage-controlled oscillator according to a fifteenth embodiment of the present invention.

With the configuration shown in FIG. 17, signal power of the oscillation frequency being accumulated at the resonator is outputted after matching an output impedance to a predetermined impedance, so the voltage-controlled oscillator of this embodiment consumes less power and is capable of efficiently supplying a large signal power to the circuit of a subsequent stage. The use of a differential Colpitts type circuitry enables to take out a differential alternating current. In addition, by configuring the resonator with inductors and capacitors, the resonator may be arranged on an integrated circuit with other elements and an external resonator is therefore not required. Consequently, the manufacturing cost of the voltage-controlled oscillator can be reduced. By including not only resistors but also capacitors as the reactance elements in the impedance-matching circuit, even an imaginary part of the output impedance can be matched. Compared with the impedance-matching circuits of FIG. 14 and FIG. 15 including resistors only, the impedance-matching circuit of this embodiment enables more accurate matching.

Meanwhile, transistors composing the differential Colpitts type circuit may be MOS transistors M1 and M2. In this case, the transformers 31 and 32 are connected to sources of the MOS transistors M1 and M2, respectively. Since the MOS transistors operate at a lower supply voltage than the bipolar transistors, a low power consumption effect can be achieved.

Embodiment 16

A sixteenth embodiment of the present invention is explained with reference to FIG. 18. A voltage-controlled oscillator of this embodiment comprises a differential alternating current generator 20 including a resonator 10, for generating two-phase alternating current having the same frequency with the resonant frequency of the resonator 10 yet being 180 degrees out of phase; and transformers 31 and 32, each having a primary inductor connected to the differential alternating current generator 20 and a secondary inductor connected to an impedance-matching circuit 40. The resonator 10 and the differential alternating current generator 20 have a typical differential Colpitts type circuitry. The resonator 10 includes inductors L11 and L12, fixed capacitors CO1 and CO2, and capacitance turnable capacitors CV11 and CV12, and the resonant frequency can be varied by changing the capacitance of CV11 and CV12 with a control voltage $V_{CONT}$. Transistors composing the differential Colpitts type circuit are bipolar transistors Q1 and Q2. The transformers 31 and 32 are connected to emitters of the bipolar transistors Q1 and Q2. The impedance-matching circuit 40 is composed of a serial circuit including resistors RZ11 and RZ12 and capacitors CZ11 and CZ12, and connected in parallel with the secondary inductors LS11, LS12 of the transformers 31 and 32. An output impedance of the voltage-controlled oscillator is set to a predetermined impedance by adjusting resistances of the resistors RZ11 and RZ12 and by adjusting capacitances of the capacitors CZ11 and CZ12.

Figure 18:
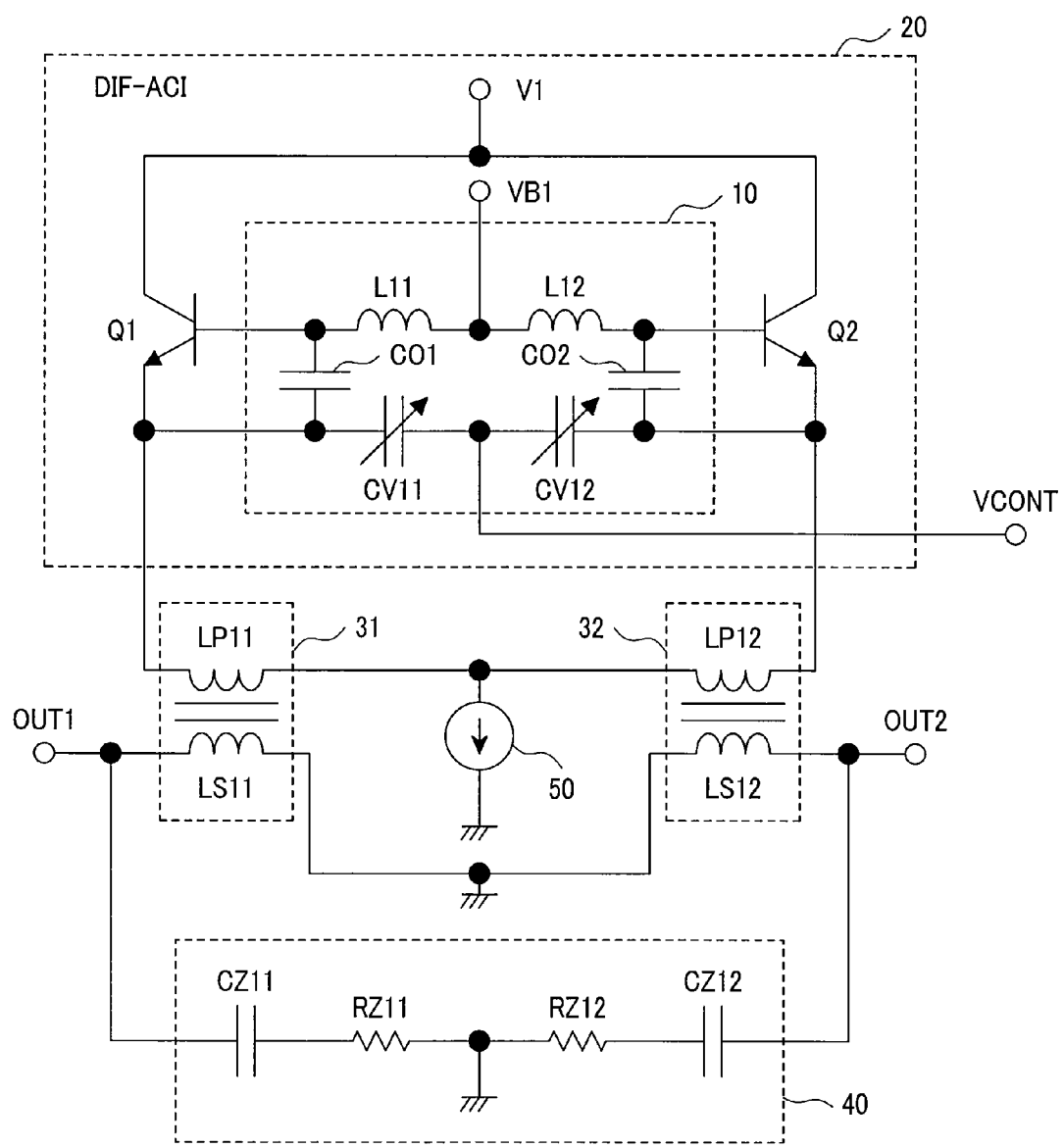
FIG. 18 is a schematic diagram of a voltage-controlled oscillator according to a sixteenth embodiment of the present invention.

With the configuration shown in FIG. 18, signal power of the oscillation frequency being accumulated at the resonator is outputted after matching an output impedance to a predetermined impedance, so the voltage-controlled oscillator of this embodiment consumes less power and is capable of efficiently supplying a large signal power to the circuit of a subsequent stage. The use of a differential Colpitts type circuitry enables to take out a differential alternating current. In addition, by configuring the resonator with inductors and capacitors, the resonator may be arranged on an integrated circuit with other elements and an external resonator is therefore not required. Consequently, the manufacturing cost of the voltage-controlled oscillator can be reduced. Now that the impedance-matching circuit 40 is connected in parallel with the secondary inductors of the transformers 31 and 32, parasitic capacitor of lines forming the transformers can be utilized as a part of impedance matching.

Meanwhile, transistors composing the differential Colpitts type circuit may be MOS transistors M1 and M2. In this case, the transformers 31 and 32 are connected to sources of the MOS transistors M1 and M2, respectively. Since the MOS transistors operate at a lower supply voltage than the bipolar transistors, a low power consumption effect can be achieved.

Embodiment 17

A seventeenth embodiment of the present invention is explained with reference to FIG. 19. A voltage-controlled oscillator of this embodiment comprises a differential alternating current generator 20 including a resonator 10, for generating two-phase alternating current having the same frequency with the resonant frequency of the resonator 10 yet being 180 degrees out of phase; and transformers 31 and 32, each having a primary inductor connected to the differential alternating current generator 20 and a secondary inductor connected to an impedance-matching circuit 40. The resonator 10 and the differential alternating current generator 20 have a typical differential Colpitts type circuitry. The resonator 10 includes inductors L11 and L12, fixed capacitors CO1 and CO2, and capacitance turnable capacitors CV11 and CV12, and the resonant frequency can be varied by changing the capacitance of CV11 and CV12 with a control voltage $V_{CONT}$. Transistors composing the differential Colpitts type circuit are bipolar transistors Q1 and Q2. The transformers 31 and 32 are connected to emitters of the bipolar transistors Q1 and Q2. The impedance-matching circuit 40 is composed of a parallel circuit including resistors RZ11 and RZ12 and capacitors CZ11 and CZ12, and connected in parallel with the secondary inductors LS11, LS12 of the transformers 31 and 32. An output impedance of the voltage-controlled oscillator is set to a predetermined impedance by adjusting resistances of the resistors RZ11 and RZ12 and by adjusting capacitances of the capacitors CZ11 and CZ12.

Figure 19:
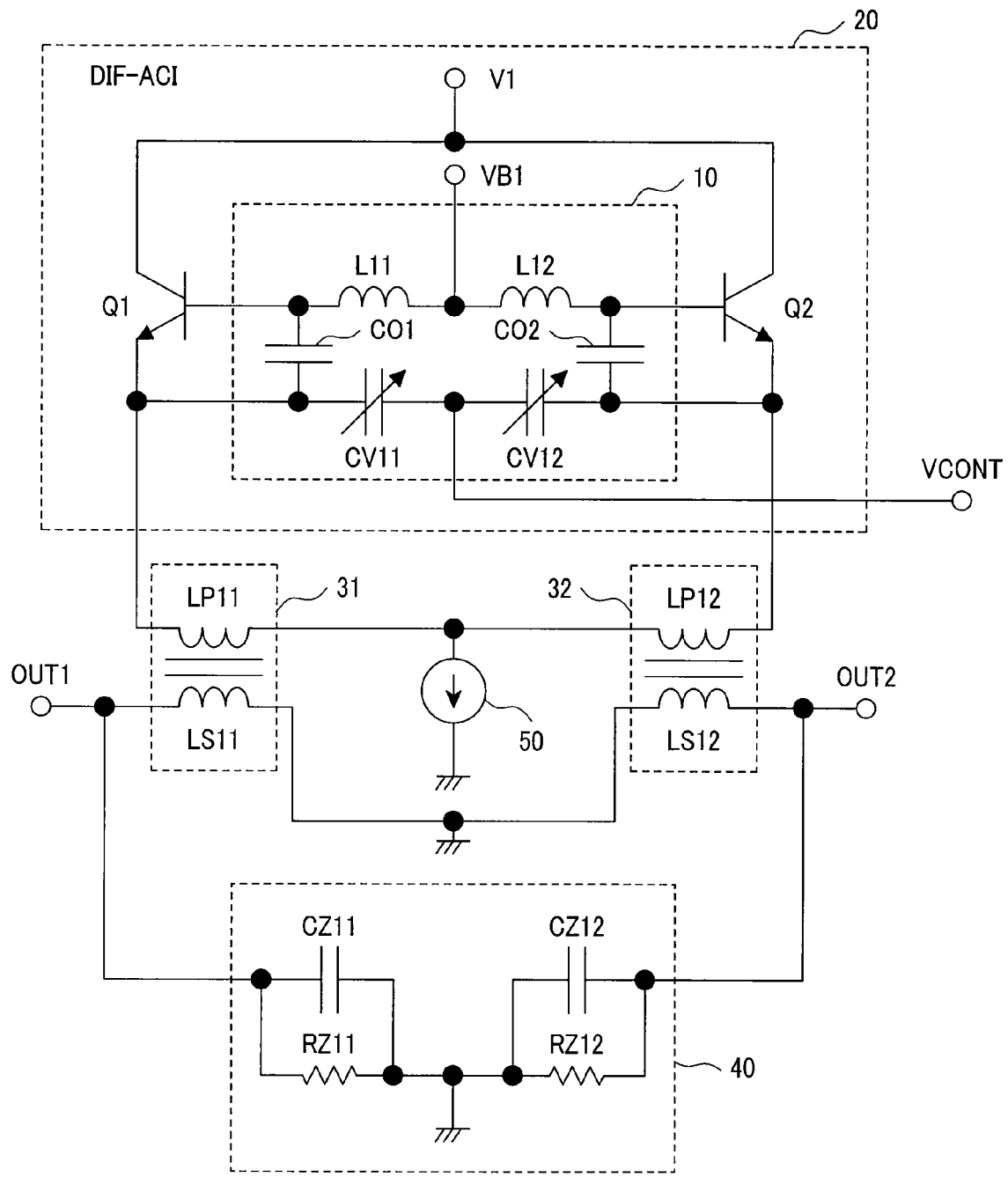
FIG. 19 is a schematic diagram of a voltage-controlled oscillator according to a seventeenth embodiment of the present invention.

With the configuration shown in FIG. 19, signal power of the oscillation frequency being accumulated at the resonator is outputted after matching an output impedance to a predetermined impedance, so the voltage-controlled oscillator of this embodiment consumes less power and is capable of efficiently supplying a large signal power to the circuit of a subsequent stage. The use of a differential Colpitts type circuitry enables to take out a differential alternating current. In addition, by configuring the resonator with inductors and capacitors, the resonator may be arranged on an integrated circuit with other elements and an external resonator is therefore not required. Consequently, the manufacturing cost of the voltage-controlled oscillator can be reduced. Now that the impedance-matching circuit 40 is connected in parallel with the secondary inductors of the transformers 31 and 32, parasitic capacitor of lines forming the transformers can be utilized as a part of impedance matching.

Meanwhile, transistors composing the differential Colpitts type circuit may be MOS transistors M1 and M2. In this case, the transformers 31 and 32 are connected to sources of the MOS transistors M1 and M2, respectively. Since the MOS transistors operate at a lower supply voltage than the bipolar transistors, a low power consumption effect can be achieved.

Embodiment 18

An eighteenth embodiment of the present invention is explained with reference to FIG. 20. A voltage-controlled oscillator of this embodiment comprises a differential alternating current generator 20 including a resonator 10, for generating two-phase alternating current having the same frequency with the resonant frequency of the resonator 10 yet being 180 degrees out of phase; and transformers 31 and 32, each having a primary inductor connected to the differential alternating current generator 20 and a secondary inductor connected to an impedance-matching circuit 40. The resonator 10 and the differential alternating current generator 20 have a differential Colpitts type circuit configuration in use of conventional bipolar transistors Q1 and Q2. The resonator 10 includes inductors L11 and L12, first fixed capacitors CO1 and CO2, and capacitance turnable capacitors CV11 and CV12, and is coupled to the emitter terminals of the bipolar transistors Q1 and Q2 via a second fixed capacitor CAC.

That is, the resonator 10 of the differential alternating current generator is composed of two bipolar transistors, and the first and second fixed capacitors, wherein each bipolar transistor is provided with a set including a resonator inductor, a turnable capacitor and the first and second fixed capacitors, and base terminals of the bipolar transistor are connected respectively to one end of the resonator inductor in each set and one end of the first fixed capacitor in each set. Moreover, the other end of the resonator inductor in one set is interconnected to the other end of the resonator inductor in another set, and together they are connected to a first voltage terminal VB1. The other end of the first fixed capacitor in each set is connected to one end of the second fixed capacitor in each set and one end of the turnable capacitor in each set, respectively. The other end of the second fixed capacitor in each set is connected to the emitter terminals of those two bipolar transistors, respectively. The other ends of the turnable capacitors in each set are interconnected, and together they are connected to an input terminal VCONT of a control voltage. Furthermore, the collector terminals of those two bipolar transistors are interconnected, and together they are connected to a second voltage terminal.

One end of the primary inductor LP11, lp12 in each of the transformers 31 and 32 is connected to an access terminal of the emitter in each of the two bipolar transistors Q1, Q2. Meanwhile, the other end of a primary inductor LP11, lp12 is interconnected to the other end of another primary inductor, and together they are connected to a current source 50. One end of the secondary inductor in each transformer is an output terminal VOUT, and the other end thereof is connected to the impedance-matching circuit 40.

The impedance-matching circuit 40 is composed of a parallel circuit including resistors RZ11 and RZ12 and capacitors CZ11 and CZ12, and connected serially to the secondary inductors LS11, LS12 of the transformers 31 and 32.

An output impedance of the voltage-controlled oscillator is set to a predetermined impedance by adjusting resistances of the resistors RZ11 and RZ12 and by adjusting capacitances of the capacitors CZ11 and CZ12.

Especially, as the resonator is coupled to those bipolar transistors via the second fixed capacitor CAC, intruding noises from an output terminal are not easily transmitted to the resonator. Therefore, the frequency stability of the voltage-controlled oscillator 20 can be improved.

Figure 20:
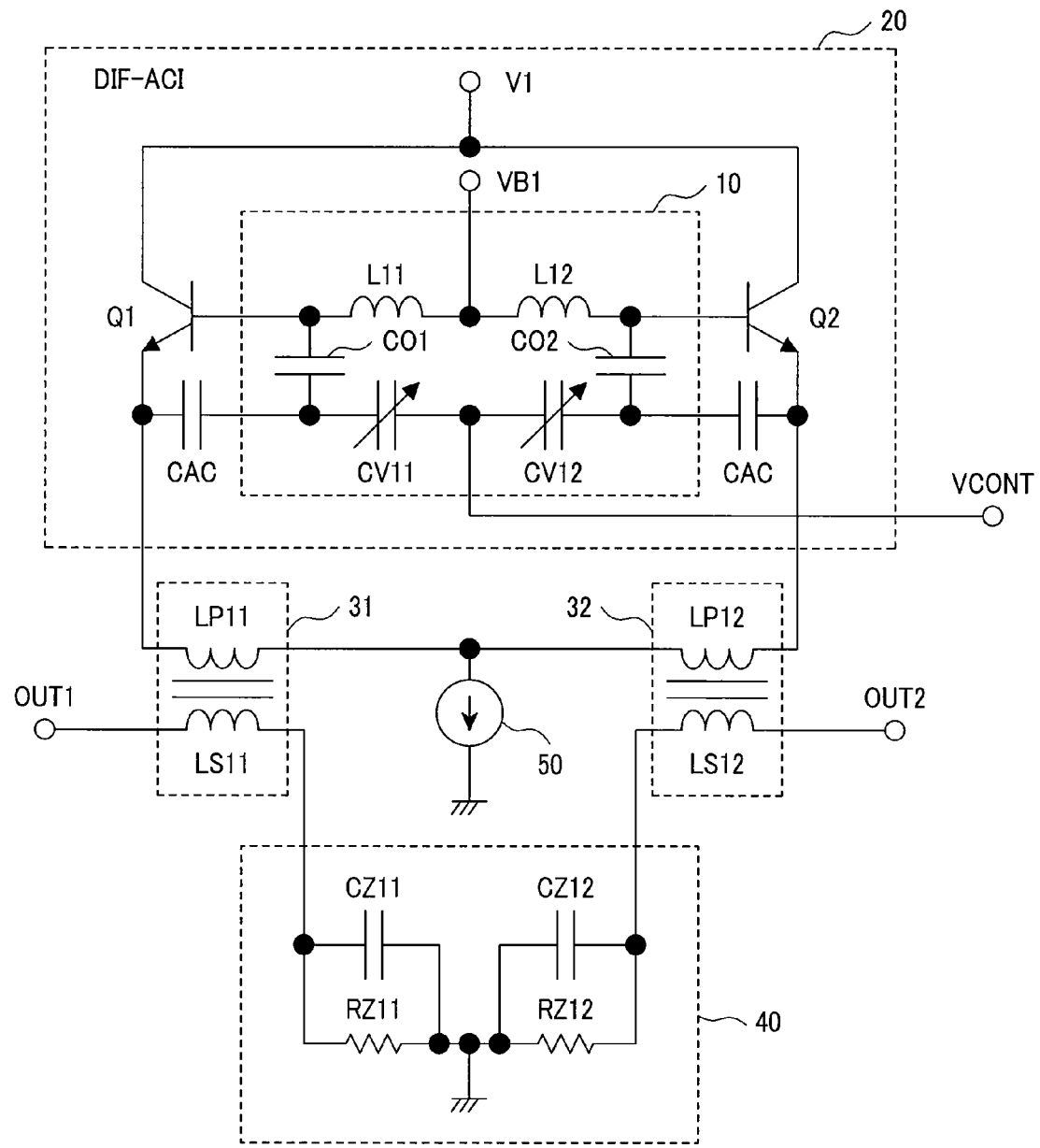
FIG. 20 is a schematic diagram of a voltage-controlled oscillator according to an eighteenth embodiment of the present invention.

With the configuration shown in FIG. 20, signal power of the oscillation frequency being accumulated at the resonator is outputted after matching an output impedance to a predetermined impedance, so the voltage-controlled oscillator of this embodiment consumes less power and is capable of efficiently supplying a large signal power to the circuit of a subsequent stage. The use of a differential Colpitts type circuitry enables to take out a differential alternating current. In addition, by configuring the resonator with inductors and capacitors, the resonator may be arranged on an integrated circuit with other elements and an external resonator is therefore not required. Consequently, the manufacturing cost of the voltage-controlled oscillator can be reduced.

On the other hand, even though the impedance-matching circuit 40 may adopt a different configuration, for example, a parallel circuit including resistors RZ11 and RZ12 and capacitors CZ11 and CZ11 and is connected in parallel with the secondary inductors of the transformers 31 and 32, the same effects are exerted with coupling via the second fixed capacitor CAC.

In addition, transistors composing the differential Colpitts type circuit may be a pair of MOS transistors M1 and M2. In this case, the transformers 31 and 32 are connected to sources of the MOS transistor pair, respectively. That is, base terminals of the MOS transistor are connected respectively to one end of the resonator inductor in each set and one end of the first fixed capacitor in each set. Moreover, the other end of the resonator inductor in one set is interconnected to the other end of the resonator inductor in another set, and together they are connected to a first voltage terminal VB1. The other end of the first fixed capacitor in each set is connected to one end of the second fixed capacitor in each set and one end of the turnable capacitor in each set, respectively. The other end of the second fixed capacitor in each set is connected to the source terminals of those two MOS transistors, respectively. The other ends of the turnable capacitors in each set are interconnected, and together they are connected to an input terminal VCONT of a control voltage. Furthermore, the drain terminals of those two MOS transistors are interconnected, and together they are connected to a second voltage terminal. Furthermore, one end of the primary inductor in each of the transformers is connected to a source terminal of the emitter in each of the two MOS transistors. Meanwhile, the other end of a primary inductor is interconnected to the other end of another primary inductor, and together they are connected to a current source 50. One end of the secondary inductor in each transformer is an output terminal VOUT, and the other end thereof is connected to the impedance-matching circuit 40. The impedance-matching circuit 40 is composed of a parallel circuit including resistors and capacitors.

As the resonator is coupled to those bipolar transistors via the second fixed capacitor CAC, intruding noises from an output terminal are not easily transmitted to the resonator. Therefore, the frequency stability of the voltage-controlled oscillator 20 can be improved. Besides, the MOS transistors operate at a lower supply voltage than the bipolar transistors, so a power consumption reducing effect can be realized.

Embodiment 19

Figure 21:
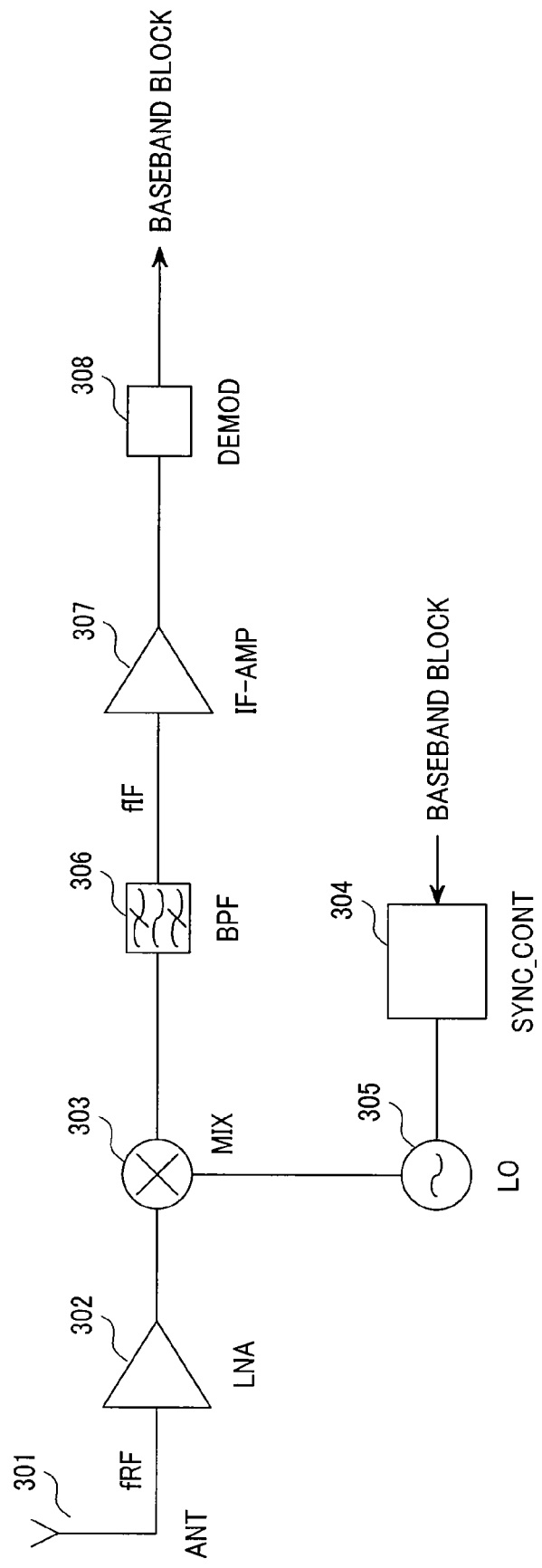
FIG. 21 is a block diagram showing the circuitry of a communication device according to a nineteenth embodiment of the present invention.

As for a nineteenth embodiment of the present invention, FIG. 21 and FIG. 22 respectively illustrate a communication device incorporating an oscillator from each of the embodiments discussed so far.

The communication device of this embodiment is a heterodyne type wireless receiver. FIG. 21 is a block diagram showing the circuitry of a communication device according to the nineteenth embodiment of the present invention, and FIG. 22 is a vertical sectional view of the communication device of the nineteenth embodiment, showing how an oscillator and a mixer are mounted on a substrate.

In FIG. 21, a signal (fRF) caught by an antenna 301 is amplified in a low noise amplifier 302 and inputted to a mixer 303. A local-oscillator signal, which is outputted from the oscillator 305 of the present invention being controlled by an oscillator controller (SVNC_CONT) 304, becomes an input signal to one side of the mixer 303. Thus, for an output from the mixer 303, carrier frequency of a received signal can be lowered and a received signal of intermediate frequency (fIF) is obtained. Undesired frequency elements in the received signal (fIF) are decayed by a band-pass filter 306. Then, the signal is amplified in the IF amplifier 307 and taken out from a demodulator (DEMOD) 308 as a baseband signal. The baseband signal is sent to an external baseband circuit (not shown). In the meantime, a control signal is provided from the baseband circuit to the oscillator controller 304.

Figure 22A:
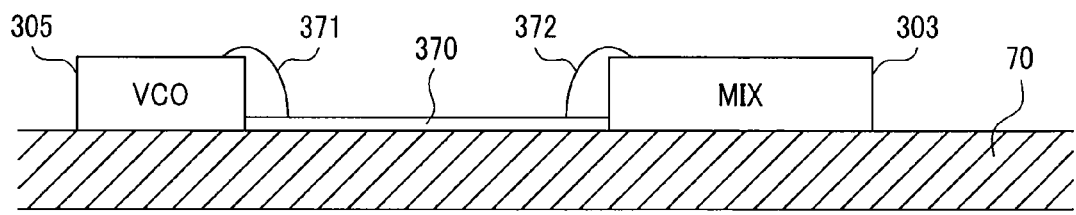
FIGS. 22A and 22B are vertical sectional views of the communication device of the nineteenth embodiment, showing how an oscillator and a mixer are mounted on a substrate.
Figure 22B:
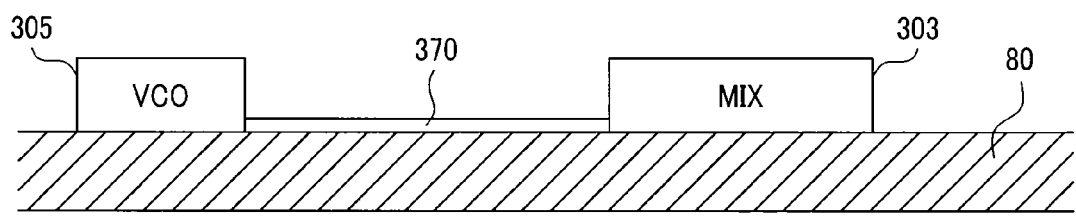

As shown in FIG. 22A, an oscillator 305 having an impedance-matching circuit and a mixer 303 that operates by an output signal from the oscillator are mounted on a same ceramic substrate, e.g., LTCC (Low Temperature Co-fired Ceramics) 70. The oscillator 305 and the mixer 303 are connected via a coplanar line or microstrip line 370 formed on the LTCC and bonding wires 371 and 372. In addition, the oscillator 305 and the mixer 303 may be configured in a manner to be fabricated on a same silicon substrate, i.e., integrated, as shown in FIG. 22B (this applies equally to other embodiments of the communication device described hereinafter).

The coplanar line 370 connected to the mixer 303 corresponds to the lines 82 and 83 of FIG. 2, and if seen from the oscillator 305 side, a predetermined impedance, such as 50Ω input impedance (load resistor), is connected to each line. According to the present invention, because an oscillation signal from the oscillator 305 is isolated from a power source circuit and outputted through a transformer, a large signal power greater than 0 dBm can be supplied to the mixer 303 at low power consumption.

That is, the use of an oscillator 305 according to one of the embodiments 1 through 18 enables to output a signal of the oscillator 305 at low power consumption and to provide a large signal power to the mixer 303 by setting the output impedance to a predetermined impedance. Therefore, the receive sensitivity of the mixer 303 is improved, noise figure is lowered, and noise performance of the receiver can be enhanced. In addition, with the impedance-matching circuit connected to an output side of the transformer, the oscillator consumes less power and this enables to lower power consumption in the heterodyne type wireless receiver.

Particularly, the voltage-controlled oscillator of the present invention is suitable for integration. Therefore, each block shown in FIG. 21 may easily be configured as a semiconductor element on a same semiconductor substrate. Furthermore, even for a radio communication module for which each block of FIG. 21 is fabricated on a separate semiconductor substrate and then connected on a board, the oscillator 305 is capable of outputting a signal after setting the output impedance to a predetermined impedance, the mixer 303 is therefore suitably provided with a large signal power.

Embodiment 20

Figure 23:
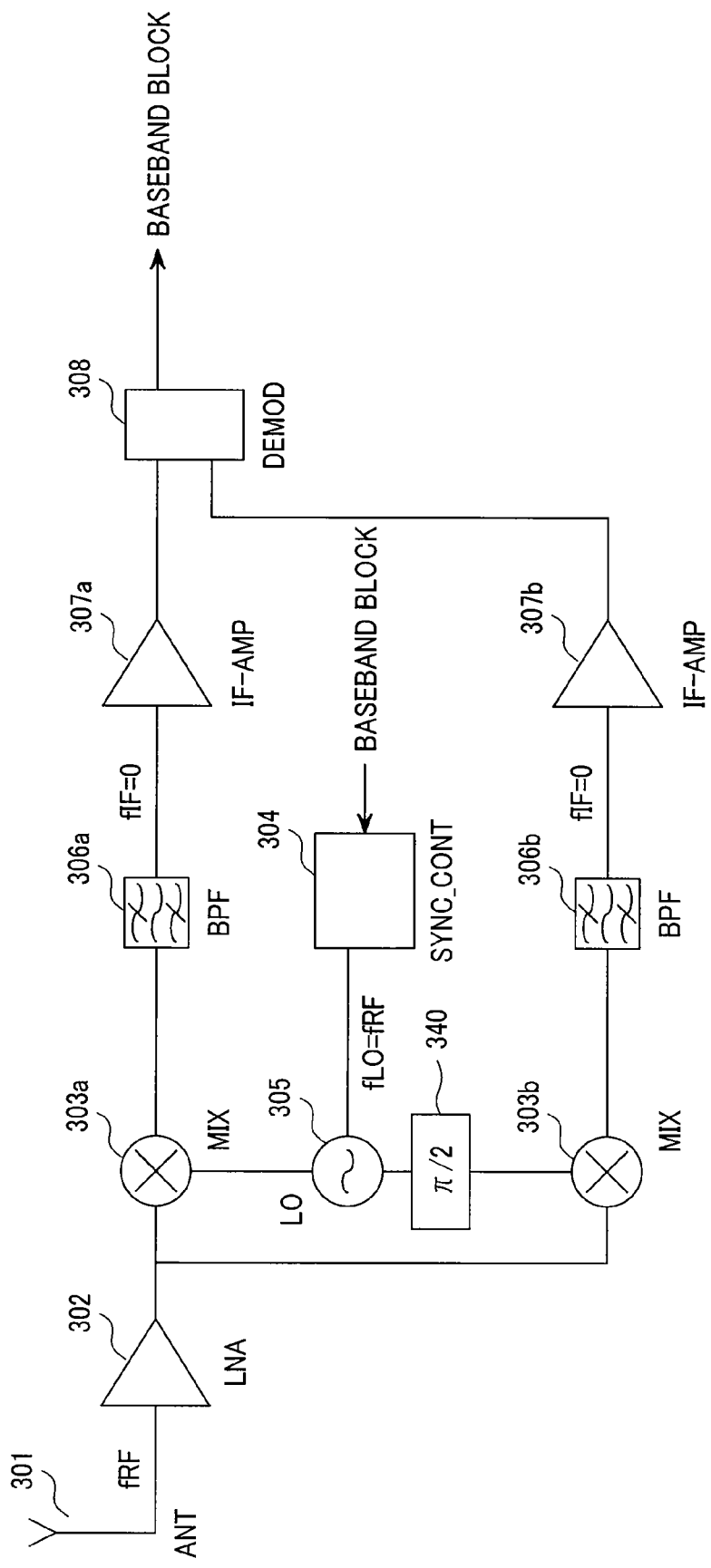
FIG. 23 is a block diagram showing the circuitry of a communication device according to a twentieth embodiment of the present invention.

FIG. 23 illustrates a communication device incorporating an oscillator as a twentieth embodiment of the present invention. The communication device of this embodiment is a direct conversion type wireless receiver. A signal (fRF) caught by an antenna 301 is amplified in a low noise amplifier 302 and inputted to two mixers 303a and 303b. A local-oscillator signal (fLO), which is outputted from the oscillator 305 of the present invention being controlled by an oscillator controller (SVNC_CONT) 304, is divided into two and these two signals are inputted to the mixers 303a and 303b, respectively, while having a 90-degree ($\pi/2$) phase contrast from a phase shifter 340. When the amplified signal being amplified in the low noise amplifier 302 is outputted from two mixers 303a and 303b, carrier frequency of the signal is lowered to zero (fIF=0) and undesired frequency elements therein are decayed by band-pass filters 306a and 306b. Then, the resulting signals are again amplified in amplifiers 307a and 307b and a demodulator 308 takes out a baseband signal from an output signal of each of the two amplifiers 307a and 307b. These baseband signals are sent out to an external baseband circuit (not shown). In the meantime, a control signal is provided from the baseband circuit to the oscillator controller 304.

The use of an oscillator 305 according to one of the embodiments 1 through 18 enables to output a signal of the oscillator 305 at low power consumption and to provide a large signal power to the mixer 303 by setting the output impedance to a predetermined impedance. Therefore, the receive sensitivity of the mixers 303a and 303b is improved, noise figure is lowered, and noise performance of the receiver can be enhanced. In addition, since the oscillator consumes less power, less power is also consumed in the direct conversion type wireless receiver using such oscillator.

Particularly, the voltage-controlled oscillator of the present invention is suitable for integration. Therefore, each block shown in FIG. 23 may easily be configured as a semiconductor element on a same semiconductor substrate. Furthermore, even for a radio communication module for which each block of FIG. 23 is fabricated on a separate semiconductor substrate and then connected on a board, the oscillator 305 is capable of outputting a signal after setting the output impedance to a predetermined impedance, the mixers 303a and 303b are therefore provided with a large signal power.

Embodiment 21

Figure 24:
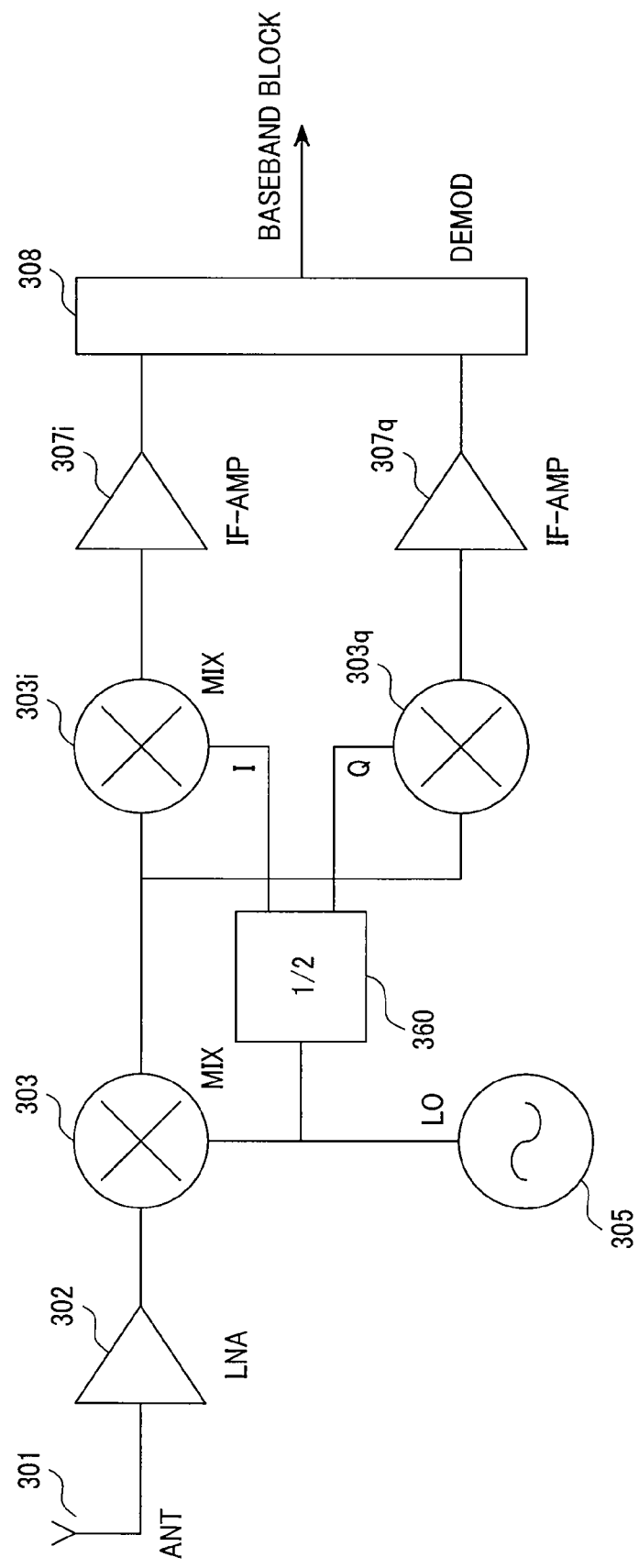
FIG. 24 is a block diagram showing the circuitry of a communication device according to a twenty-first embodiment of the present invention.

FIG. 24 illustrates a communication device incorporating an oscillator as a twenty-first embodiment of the present invention. The communication device of this embodiment is a sliding IF type wireless receiver. A signal caught by an antenna 301 is amplified in a low noise amplifier 302 and inputted to a mixer 303. Also, the mixer 303 receives a local-oscillator signal which is outputted from the oscillator 305 of the present invention. An output signal of the mixer 303 is divided into two and these two signals are inputted to mixers 303i and 303q, respectively. In order to have a 90-degree ($\pi/2$) phase contrast from a phase shifter 340, an output of the present invention oscillator is inputted to a frequency divider 360, and two outputs of the frequency divider 360 are inputted to the mixers 303i and 303q, respectively. Then, the resulting signals are again amplified in amplifiers 307i and 307q and a demodulator 308 takes out a baseband signal from an output signal of each of the two amplifiers 307a and 307b. These baseband signals are sent out to an external baseband circuit (not shown).

The use of an oscillator 305 according to one of the embodiments 1 through 18 enables to output a signal of the oscillator 305 at low power consumption and to provide a large signal power to the mixer 303 by setting the output impedance to a predetermined impedance. Therefore, the receive sensitivity of the mixers 303i and 303q is improved, noise figure is lowered, and noise performance of the receiver can be enhanced. In addition, since the oscillator consumes less power, less power is also consumed in the direct conversion type wireless receiver using such oscillator.

Particularly, the voltage-controlled oscillator of the present invention, which is suitable for integration is adopted in the oscillator 305. Therefore, each block shown in FIG. 24 may easily be configured as a semiconductor element on one semiconductor substrate. Furthermore, even for a radio communication module for which each block of FIG. 24 is fabricated on a separate semiconductor substrate and then connected on a board, the oscillator 305 is capable of outputting a signal after setting the output impedance to a predetermined impedance, and the mixer 303 is therefore suitably provided with a large signal power.

Embodiment 22

Figure 25:
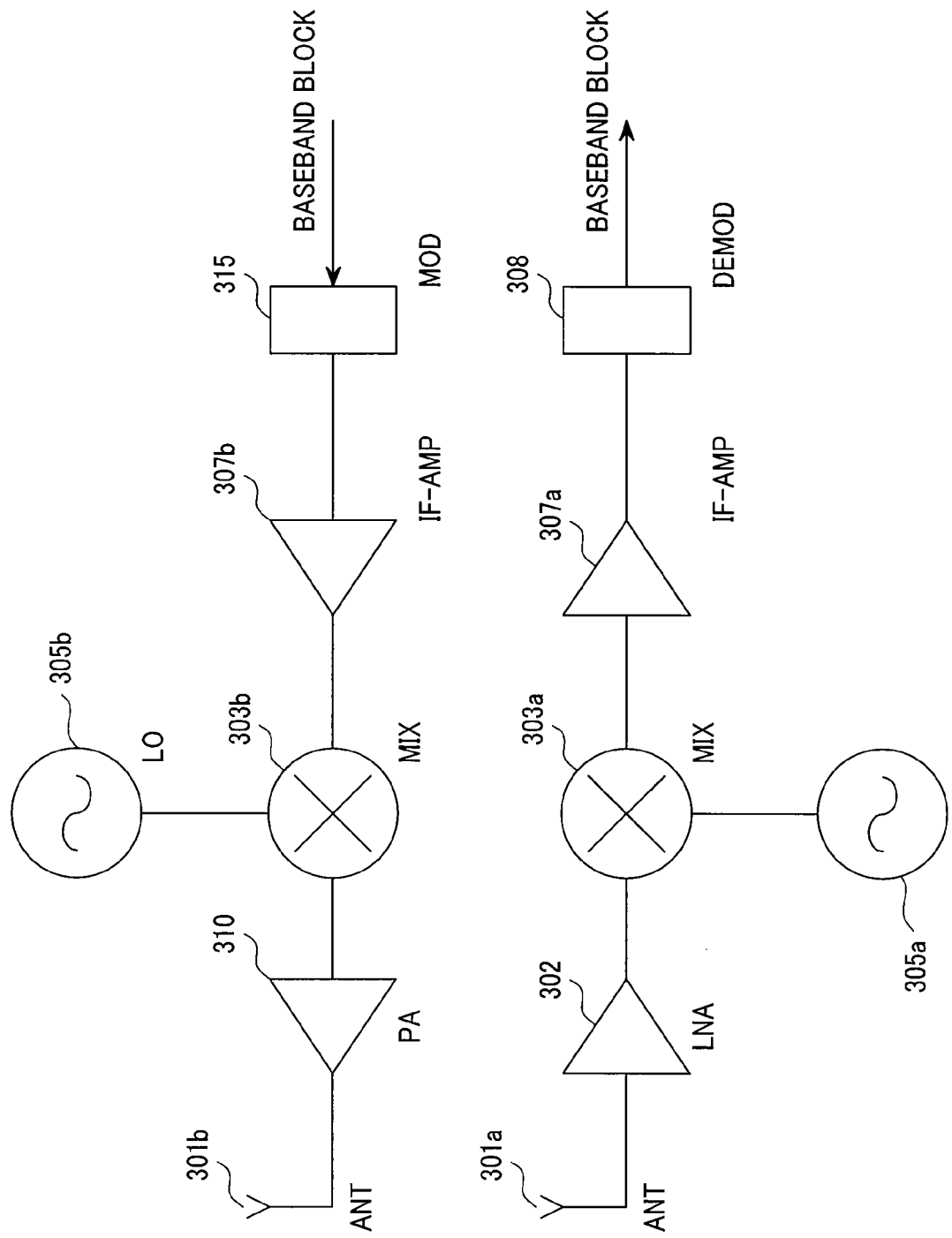
FIG. 25 is a block diagram showing the circuitry of a communication device according to a twenty-second embodiment of the present invention.

FIG. 25 illustrates a communication device incorporating an oscillator as a twenty-second embodiment of the present invention. The communication device of this embodiment is a heterodyne type wireless transceiver. In FIG. 25, a signal caught by an antenna 301a is amplified in a low noise amplifier 302 and inputted to a mixer 303a. A local-oscillator signal, which is outputted from the oscillator 305a of the present invention, becomes an input signal to one side of the mixer 303a. Thus, for an output from the mixer 303a, carrier frequency of a received signal can be lowered and a received signal of intermediate frequency (IF) is obtained. The IF received signal is then amplified in the IF amplifier 307a, and taken out as a baseband signal in a demodulator (DEMOD) 308. The baseband signal is sent to an external baseband circuit (not shown).

During transmission, the transmitted baseband signal being outputted from the baseband circuit (not shown) is modulated by a modulator (MOD) 315, amplified in the IF amplifier 307b, and inputted to a mixer 303b. The mixer 303b also receives a local-oscillator signal, which is outputted from an oscillator 305b of the present invention. An output of the mixer 303b is amplified in a high-output amplifier 310 and sent out to an antenna 301b to be transmitted.

The use of oscillators 305a and 305b according to one of the embodiments 1 through 18 enables to output a signal of the oscillator 305 at low power consumption and to provide a large signal power to the mixer 303 (303a, 303b) by setting the output impedance to a predetermined impedance. Therefore, the receive sensitivity of each of the mixer 303 is improved, noise figure is lowered, and noise performance of the receiver can be enhanced. In addition, since the oscillator consumes less power, less power is also consumed in the heterodyne type wireless transceiver using such oscillator.

Particularly, the voltage-controlled oscillators 305a and 305b of the present invention are suitable for integration. Therefore, each block shown in FIG. 25 may easily be configured as a semiconductor device on a same semiconductor substrate. Furthermore, even for a radio communication module for which each block of FIG. 25 is fabricated on a separate semiconductor substrate and then connected on a board, the oscillators 305a and 305b are capable of outputting a signal after setting the output impedance to a predetermined impedance, and the mixers 303a and 303b are therefore provided with a large signal power.

Embodiment 23

Figure 26:
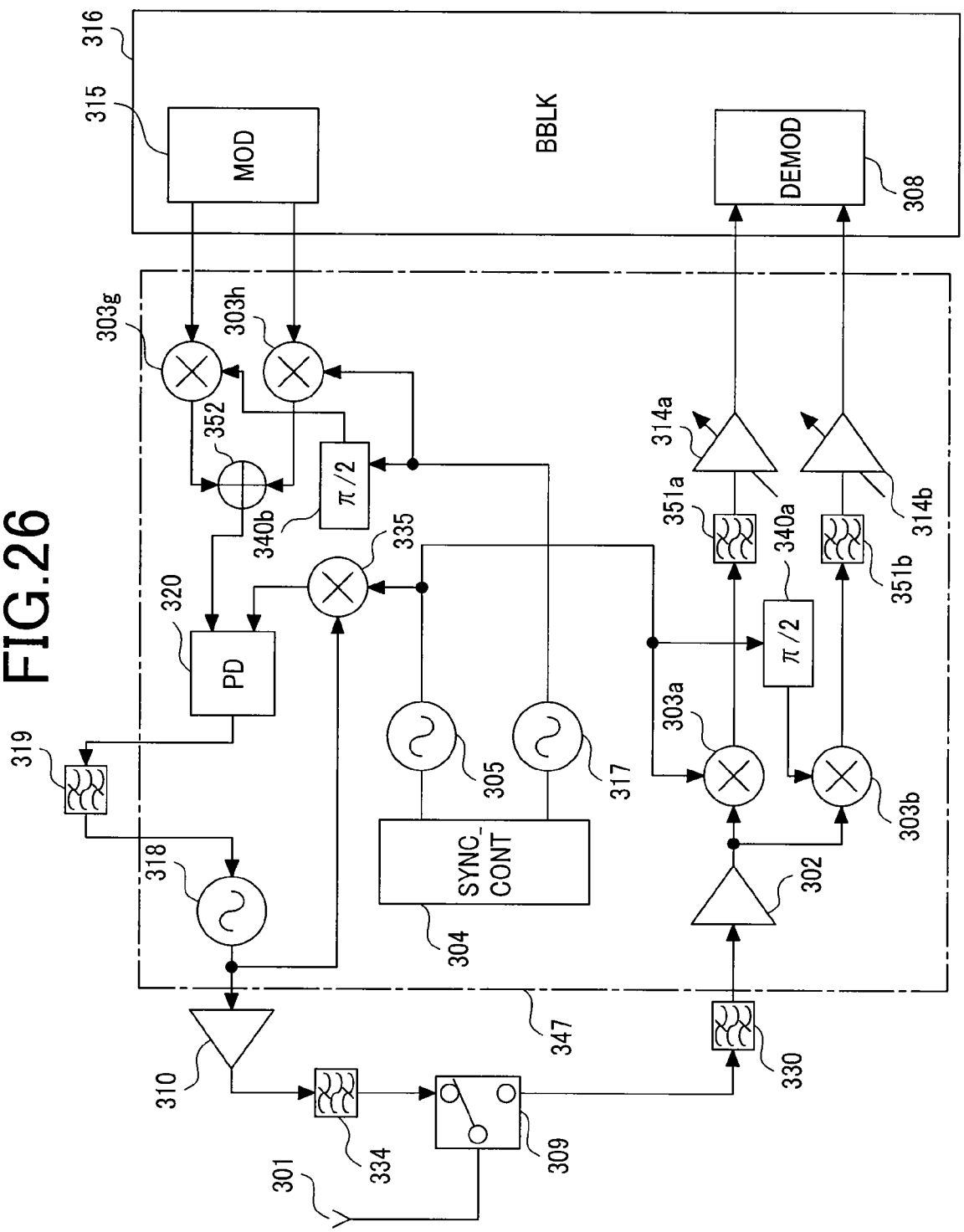
FIG. 26 is a block diagram showing the circuitry of a communication device according to a twenty-third embodiment of the present invention.

FIG. 26 illustrates a communication device incorporating an oscillator as a twenty-third embodiment of the present invention. The communication device of this embodiment is a direct conversion type wireless transceiver. A signal is caught by an antenna 301 and passes through a switch (SW) 309. Undesired frequency elements in the received signal are decayed by a band-pass filter 330, and the resulting signal is then amplified in a low noise amplifier 302 and inputted to two mixers 303a and 303b. Also, the mixers 303a and 303b receive an RF (Radio Frequency) local-oscillator signal which is outputted from the oscillator 305 of the present invention under the control of an oscillator controller 304. An RF local-oscillator signal being outputted from the oscillator 305 of the present invention is divided into two and receives a 90-degree ($\pi/2$) phase contrast from a phase shifter 340a. The resulting signals are inputted to mixers 303a and 303b, respectively. In the case of the outputs from two mixers 303a and 303b, carrier frequency of the signal is lowered to zero and undesired frequency elements therein are decayed by low-pass filters 351a and 351b. Then, the resulting signals are again amplified in amplifiers 314a and 314b with automatic gain control (AGC amplifiers). An output signal from each of the AGC amplifiers 314a and 314b is sent to a baseband circuit BBLK 316a, and taken out as a received baseband signal by a demodulator 308.

During transmission, the transmitted baseband signal from the baseband circuit 316 is modulated by a modulator MOD 315 and divided into two signals with a 90-degree phase contrast. These two signals are inputted to mixers 303g and 303h, respectively. Also, an RF local-oscillator signal, which is outputted from the present invention oscillator 317 under the control of an oscillator controller 304, is divided into two. These two signals receive a 90-degree ($\pi/2$) phase contrast in a phase shifter 340b and are inputted to the mixers 303g and 303h, respectively. Outputs from the two mixers 303g and 303h are added to each other in an orthogonal modulation type adder 352 to become an RF orthogonal modulation signal. This RF orthogonal modulation signal is inputted as a reference frequency to a phase detector PD (or a phase frequency detector PFD) 320 included in a PLL. Also, an output signal of a voltage-controlled oscillator 318 included in the PLL is feedback inputted into the phase detector (or the phase frequency detector) 320 via a frequency divider 335. A phase contrast element obtained by the phase detection performed in the phase detector 320 goes through a loop filter 319 to turn to a direct current, and its output voltage is impressed to the voltage-controlled oscillator 318. A high-frequency signal outputted from the voltage-controlled oscillator 318 is amplified in a high output amplifier 310 and undesired frequency elements therein are decayed by a band-pass filter 334. The resulting signal is then sent out to the antenna 301 via the switch SW 309.

The use of oscillator 305 according to one of the embodiments 1 through 18 enables to output a signal of the oscillator 305 at low power consumption and to provide a large signal power to of each the mixer 303 (303a, 303b, 303g, 303h) by setting the output impedance to a predetermined impedance. Therefore, the receive sensitivity of the mixer 303 is improved, noise figure is lowered, and noise performance of the receiver can be enhanced. In addition, since the oscillator consumes less power, less power is also consumed in the direct conversion type wireless transceiver using such oscillator.

Particularly, the voltage-controlled oscillator 305 of the present invention is suitable for integration. Therefore, the receiving side from the low noise amplifier 302 to the AGC amplifiers 314a and 314b, the transmission side from the mixers 303g and 303h to the voltage-controlled oscillator 318, and the transceiver including the oscillator controller 304 and the oscillators 305 and 317 shown in FIG. 26 may easily be configured as semiconductor devices on one semiconductor substrate 347. Furthermore, even for a radio communication module for which each block of FIG. 26 is fabricated on a separate semiconductor substrate and then connected on a board, the oscillator 305 is capable of outputting a signal after setting the output impedance to a predetermined impedance, and the mixers 303a, 303b, 303g, and 303h are therefore provided with a large signal power.

Embodiment 24

Figure 27:
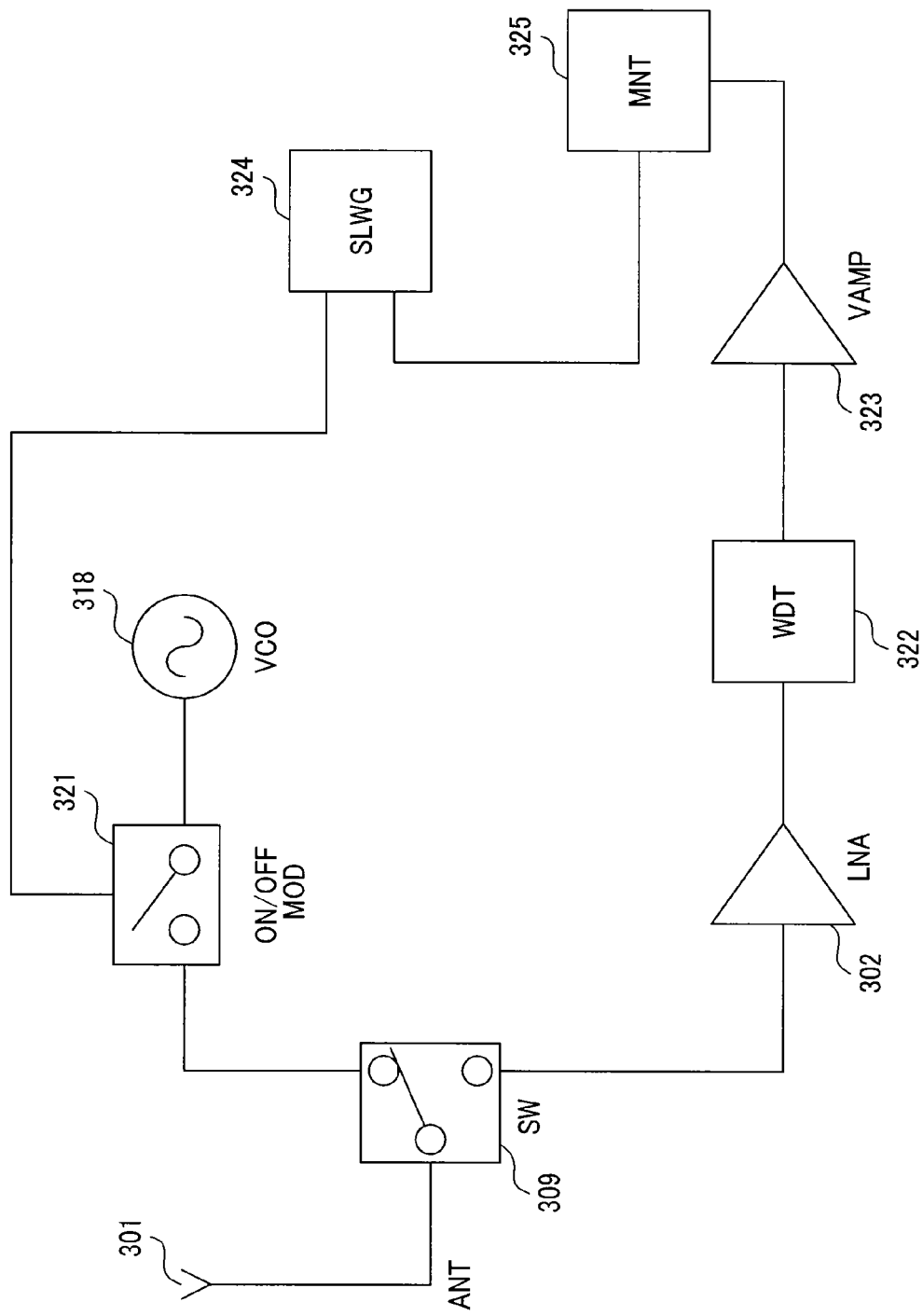
FIG. 27 is a block diagram showing the circuitry of a communication device according to a twenty-fourth embodiment of the present invention.
Figure 28:
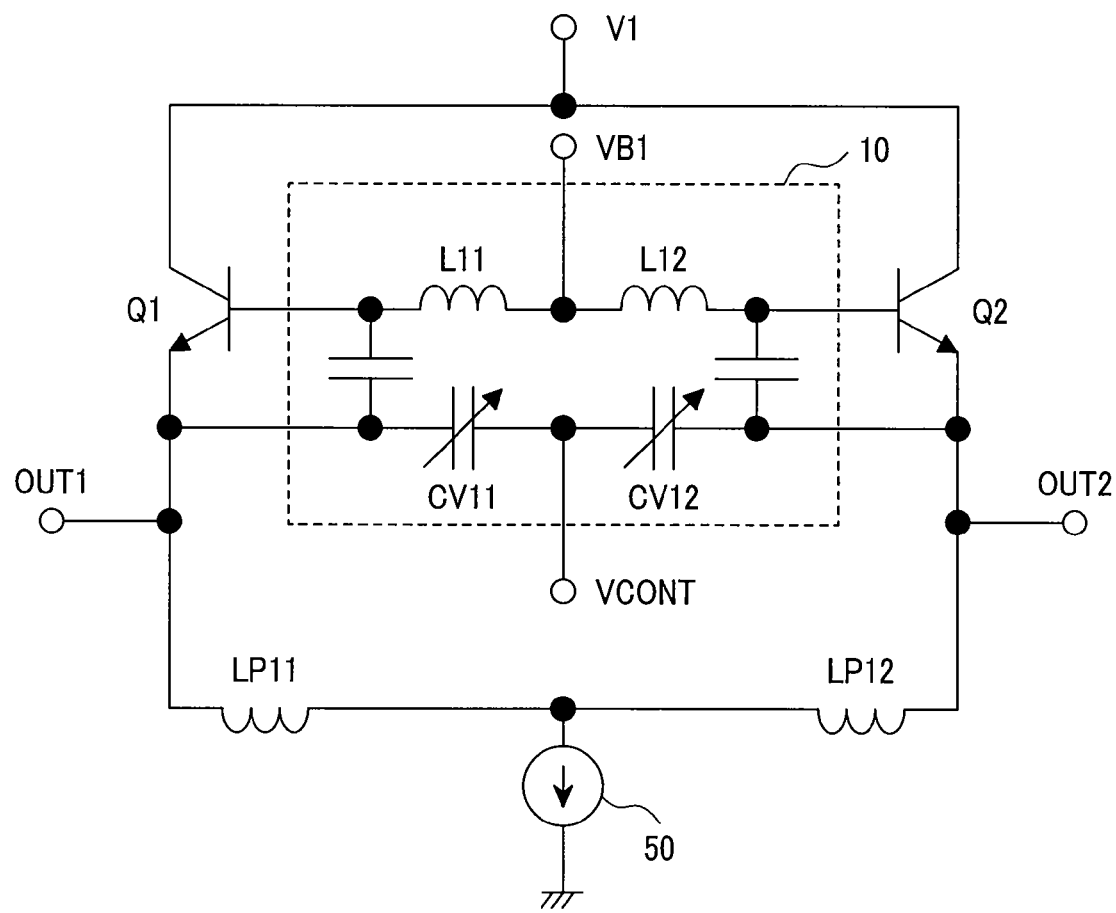
FIG. 28 is an example of a circuitry of a conventional voltage-controlled oscillator.
Figure 29:
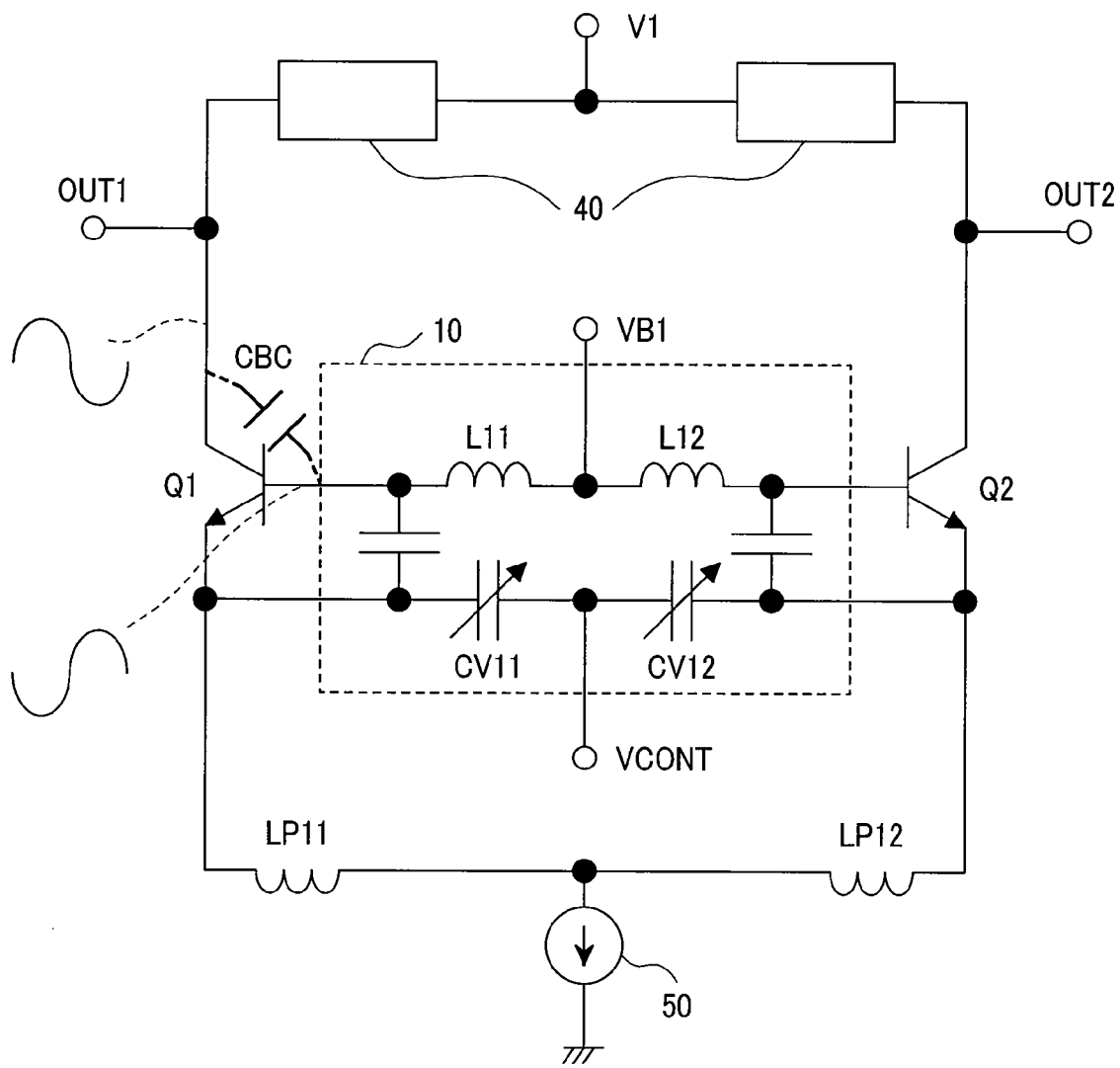
FIG. 29 is another example of a circuitry of a conventional voltage-controlled oscillator.
Figure 30:
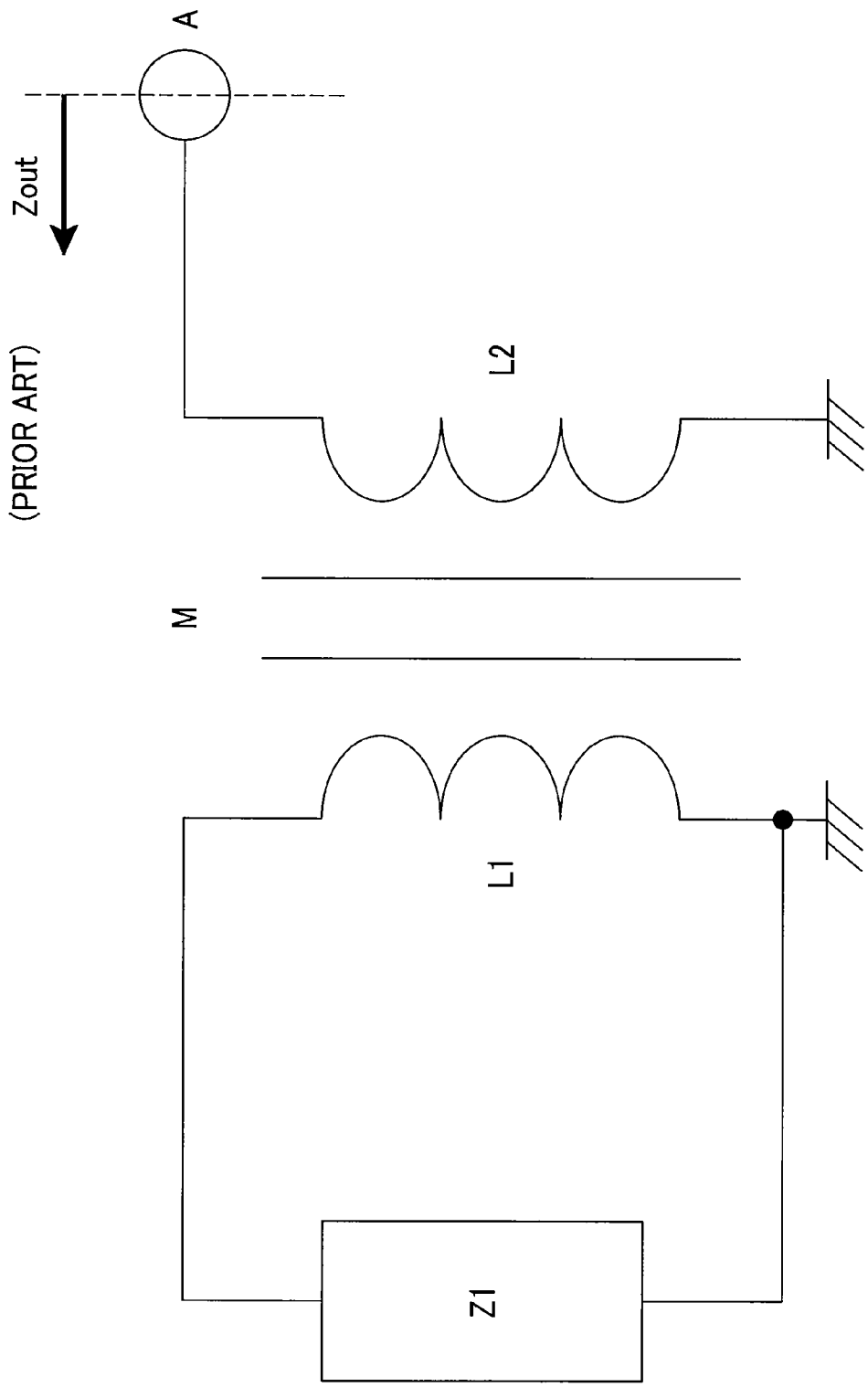
FIG. 30 is a drawing for explaining an impedance conversion scheme using a conventional transformer.

FIG. 27 illustrates a communication device incorporating an oscillator as a twenty-fourth embodiment of the present invention. The communication device of this embodiment is a pulse radar type wireless radar transceiver.

During transmission, an output signal from the present invention oscillator 318 is modulated in an ON/OFF modulator (ON/OFF MOD) 321 that is turned on/off by an output from a sawtooth wave generator (SLWG) 324, and sent out the modulated signal to an antenna 301 via a switch 309.

During reception, a signal is caught in an antenna 301 and goes through the switch 309. This signal is then amplified in a low noise amplifier 302 and detected in a detector (WPT) 322. The detected signal is amplified in a video amplifier 323 and displayed on a screen of a display device (MNT) 325.

A transceiver circuit including the oscillator 318, the ON/OFF MOD 321, the SLWG 324, the switch 309, the low noise amplifier 302, and the WDT 322 may easily be fabricated as a semiconductor device on a same semiconductor substrate.

The use of oscillator 318 according to one of the embodiments 1 through 18 enables to output a signal of the oscillator 326 at low power consumption and to provide a large signal power to the ON/OFF MOD 321 by setting the output impedance to a predetermined impedance. Therefore, the receive sensitivity of the ON/OFF MOD 321 is improved, noise figure is lowered, and noise performance of the receiver can be enhanced. In addition, since the oscillator consumes less power, less power is also consumed in the pulse radar type wireless radar transceiver using such oscillator.

It is needless to mention that the effects of the present invention obtained by one of the embodiments 1 through 24 are not limited to the use of bipolar transistor or MOS transistor as its circuit element, but the same effects are exerted by substituting the bipolar or MOS transistor into FET, hetero junction bipolar transistor, and HEMT. Moreover, even though a P-type semiconductor and an N-type semiconductor of the device may be replaced, the same effects are exerted.

While the present invention has been described with respect to the specific embodiments, it will be apparent to those skilled in the art that various changes and modifications may be made without departing from the spirit and scope of the invention as defined in the following claims.

What is claimed is:

1. A voltage-controlled oscillator, comprising: a differential Colpitts oscillator including a pair of bipolar transistors and a resonator to vary resonant frequency based on an input control voltage; a pair of transformers each having a respective primary inductor and a respective secondary inductor coupled by a mutual inductance, each said primary inductor being connected at a first end thereof to an emitter terminal of an associated one of the pair of bipolar transistors; an impedance-matching circuit connected to the respective secondary inductors of the pair of transformers; and a current source, wherein respective second ends of said primary inductors are coupled together and to the current source, and wherein differential alternating current outputted from the differential Colpitts oscillator is inputted to the respective primary inductors, and an output signal is outputted from respective first ends of each of the secondary inductors of the pair of transformers.

2. The voltage-controlled oscillator according to claim 1, wherein the resonator includes inductors and tunable capacitors.

3. The voltage-controlled oscillator according to claim 2, wherein the impedance-matching circuit is connected in parallel with each secondary inductor of the pair of transformers.

4. The voltage-controlled oscillator according to claim 1,
wherein the impedance-matching circuit is connected serially to each secondary inductor of the pair of transformers, and
wherein a first end of the impedance matching circuit is connected to a second end of one of said secondary inductors and a second end of the impedance matching circuit is connected to a second end of the other of said secondary inductors.

5. The voltage-controlled oscillator according to claim 1,
wherein each bipolar transistor is associated with a respective component set including a resonator inductor, a tunable capacitor, a first fixed capacitor, and a second fixed capacitor,
wherein a base terminal of each bipolar transistor is connected to a first end of the associated resonator inductor and a first end of the associated first fixed capacitor,
wherein a second end of the resonator inductor in each component set is interconnected to a second end of the resonator inductor in the other component set, thereby being connected together to a first voltage terminal,
wherein a second end of each first fixed capacitor in each component set is connected to a first end of the second fixed capacitor in that component set and a first end of the tunable capacitor in that component set,
wherein a second end of the second fixed capacitor in each set is connected to the emitter terminal of the associated bipolar transistor,
wherein second ends of the tunable capacitors are interconnected, thereby being connected together to an input terminal of the control voltage,
wherein collector terminals of the two bipolar transistors are interconnected, thereby being connected to a second voltage terminal,
wherein the emitter terminal of each bipolar transistor is connected to the first end of the associated primary inductor, and
wherein a first end of the secondary inductor in each transformer is an output terminal and a second end thereof is connected to the impedance-matching circuit, the impedance-matching circuit being composed of a parallel circuit including resistors and capacitors.

6. The voltage-controlled oscillator according to claim 1, wherein the differential Colpitts oscillator, the pair of transformers, and the impedance-matching circuit are formed on a common Si substrate.

7. The voltage-controlled oscillator according to claim 6, wherein a noise blocking fixed capacitor is connected between each of the primary inductors and associated emitter terminals.

8. A communication device, comprising:
a substrate;
a voltage-controlled oscillator provided on the substrate;
a signal processor provided on the substrate; and
a bonding line provided on the substrate to connect the voltage-controlled oscillator with the signal processor,
wherein the voltage-controlled oscillator comprises:
a differential Colpitts oscillator including a pair of bipolar transistors and a resonator to vary resonant frequency based on an input control voltage;
a pair of transformers each having a respective primary inductor and a respective secondary inductor coupled by a mutual inductance, each said primary inductor being connected at a first end thereof to an emitter terminal of an associated one of the pair of bipolar transistors;
an impedance-matching circuit connected to the respective secondary inductors of the pair of transformers; and
a current source,
wherein respective second ends of said primary inductors are coupled together and to the current source,
wherein differential alternating current outputted from the differential Colpitts oscillator is inputted to the respective primary inductors, and an output signal is outputted from respective first ends of each of the secondary inductors of the pair of transformers, and
wherein the signal processor is responsive to a high frequency output signal from the voltage-controlled oscillator.

9. The communication device according to claim 8,
wherein the signal processor includes a transmission mixer and a receiving mixer, each of which being controlled by the voltage-controlled oscillator, and
wherein a low noise amplifier, the receiving mixer, a receiving oscillator, the transmission mixer, and a transmission oscillator are mounted on the substrate.

10. The communication device according to claim 8, further comprising:
a low noise amplifier to amplify a signal received by a receiving antenna;
a receiving mixer to convert a frequency of an output signal of the low noise amplifier;
a receiving oscillator to generate a local-oscillator signal for frequency conversion and output the signal to the receiving mixer;
a transmission mixer to convert the frequency of a signal to be transmitted;
a transmission oscillator to generate a local- oscillator signal for frequency conversion and output the signal to the transmission mixer;
a power amplifier to amplify an output signal of the transmission mixer; and
a transmission antenna to transmit an output of the power amplifier,
wherein at least one of the receiving oscillator and the transmission oscillator includes the voltage-controlled oscillator.

11. The communication device according to claim 10, wherein the low noise amplifier, the receiving mixer, the receiving oscillator, the transmission mixer, the transmission oscillator, and the power amplifier are mounted on the substrate.

12. The communication device according to claim 8,
wherein the communication device is a pulse radar type wireless radar transceiver,
wherein the signal processor is an ON/OFF modulator turning on/off by an output of a saw-tooth wave generator, and
wherein the ON/OFF modulator modulates an output signal of the voltage-controlled oscillator and sends out to an antenna for transmission.

13. A voltage-controlled oscillator, comprising:
a differential Colpitts oscillator including a pair of MOS transistors and a resonator to vary resonant frequency based on an input control voltage;
a pair of transformers each having a respective primary inductor and a respective secondary inductor coupled by a mutual inductance, each said primary inductor being connected at a first end thereof to a source terminal of an associated one of the pair of MOS transistors;
an impendence-matching circuit connected to the respective secondary inductors of the pair of transformers; and
a current source,
wherein respective second ends of said primary inductors are coupled together and to the current source, and
wherein differential alternating current outputted from the differential Colpitts oscillator is inputted to the respective primary inductors, and an output signal is outputted from respective first ends of each of the secondary inductors of the pair of transformers.

14. The voltage-controlled oscillator according to claim 13, wherein the resonator includes inductors and tunable capacitors.

15. The voltage-controlled oscillator according to claim 14, wherein the impedance-matching circuit is connected in parallel with each secondary inductor of the pair of transformers.

16. The voltage-controlled oscillator according to claim 13,
wherein the impedance-matching circuit is connected serially to each secondary inductor of the pair of transformers, and
wherein a first end of the impedance matching circuit is connected to a second end of one of said secondary inductors and a second end of the impedance matching circuit is connected to a second end of the other of said secondary inductors.

17. The voltage-controlled oscillator according to claim 13,
wherein each MOS transistor is associated with a respective component set including a resonator inductor, a tunable capacitor, a first capacitor, and a second fixed capacitor,
wherein a gate terminal of each MOS transistor is connected to a first end of the associated resonator inductor and a first end of the associated first fixed capacitor,
wherein a second end of the resonator inductor in each component set is interconnected to a second end of the resonator inductor in the other component set, thereby being connected together to a first voltage terminal,
wherein a second end of each first fixed capacitor in each component set is connected to a first end of the second fixed capacitor in that component set and a first end of the tunable capacitor in that component set,
wherein a second end of the second fixed capacitor in each component set is connected to the source terminal of the associated MOS transistor,
wherein second ends of the tunable capacitors are interconnected, thereby being connected together to an input terminal of the control voltage,
wherein drain terminals of the two MOS transistors are interconnected, thereby being connected to a second voltage terminal,
wherein the source terminal of each MOS transistor is connected to the first end of the associated primary inductor, and
wherein a first end of the secondary inductor in each transformer is an output terminal and a second end thereof is connected to the impedance-matching circuit, the impedance-matching circuit being composed of a parallel circuit including resistors and capacitors.

18. The voltage-controlled oscillator according to claim 13, wherein the differential Colpitts oscillator, the pair of the transformers, and the impedance-matching circuit are formed on a common Si substrate.

19. The voltage-controlled oscillator according to claim 18, wherein a noise blocking fixed capacitor is connected between each of the primary inductors and associated source terminals.

20. A communication device, comprising:
a substrate;
a voltage-controlled oscillator provided on the substrate;
a signal processor provided on the substrate; and
a bonding line provided on the substrate to connect the voltage-controlled oscillator with the signal processor, terminal,
wherein the voltage-controlled oscillator comprises:
a differential Colpitts oscillator including a pair of MOS transistors and a resonator to vary resonant frequency based on an input control voltage;
a pair of transformers each having a respective primary inductor and a respective secondary inductor coupled by mutual inductance, each said primary inductor being connected at a first end thereof to a source terminal of an associated one of the pair of MOS transistors;
an impedance-matching circuit connected to the respective secondary inductors of the pair of transformers; and
a current source,
wherein respective second ends of said primary inductors are coupled together and to the current source,
wherein differential alternating current outputted from the differential Colpitts oscillator is inputted to the respective primary inductors, and an output signal is outputted from respective first ends of each of the secondary inductors of the pair of transformers, and
wherein the signal processor operates in response to a high frequency output signal from the voltage-controlled oscillator.

21. The communication device according to claim 20,
wherein the signal processor includes a transmission mixer and a receiving mixer, each of which being controlled by the voltage-controlled oscillator, and
wherein a low noise amplifier, the receiving mixer, a receiving oscillator, the transmission mixer, and a transmission oscillator are mounted on the substrate.

22. The communication device according to claim 20, further comprising:
a low noise amplifier to amplify a signal received by a receiving antenna;
a receiving mixer to convert a frequency of an output signal of the low noise amplifier;
a receiving oscillator to generate a local-oscillator signal for frequency conversion and output the signal to the receiving mixer;

a transmission mixer to convert the frequency of a signal to be transmitted;

a transmission oscillator to generate a local-oscillator signal for frequency conversion and output the signal to the transmission mixer;

a power amplifier to amplify an output signal of the transmission mixer; and a transmission antenna to transmit an output of the power amplifier, wherein at least one of the receiving oscillator and the transmission oscillator includes the voltage-controlled oscillator.

23. The communication device according to claim 22, wherein the low noise amplifier, the receiving mixer, the receiving oscillator, the transmission mixer, the transmission oscillator, and the power amplifier are mounted on the substrate.

24. The communication device according to claim 20, wherein the communication device is a pulse radar type wireless radar transceiver, wherein the signal processor is an ON/OFF modulator turning on/off by an output of a saw-tooth wave generator, and wherein the ON/OFF modulator modulates an output signal of the voltage controlled oscillator and sends out to an antenna for transmission.

* * * * *